(12) United States Patent
Uematsu et al.

(10) Patent No.: US 6,461,947 B1
(45) Date of Patent: Oct. 8, 2002

(54) PHOTOVOLTAIC DEVICE AND MAKING OF THE SAME

(75) Inventors: Tsuyoshi Uematsu, Kodaira (JP); Yoshiaki Yazawa, Hoya (JP); Hiroyuki Ohtsuka, Annaka (JP); Ken Tsutsui, Hinode (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/657,358

(22) Filed: Sep. 7, 2000

(30) Foreign Application Priority Data

Sep. 7, 1999 (JP) .......................................... 11-252630

(51) Int. Cl.⁷ .......................... H01L 31/18; H01L 21/22
(52) U.S. Cl. ........................ 438/542; 438/57; 438/510; 438/549; 438/558; 438/560; 438/565; 438/567; 136/255; 136/252; 136/256; 257/461; 257/463; 257/465; 257/452
(58) Field of Search .......................... 438/57, 510, 542, 438/549, 558, 560, 565, 567; 136/255, 252, 256; 257/461, 463, 465, 452

(56) References Cited

U.S. PATENT DOCUMENTS

| | | | | |
|---|---|---|---|---|
| 3,852,128 A | * | 12/1974 | Kreuzer | 438/5 |
| 4,158,591 A | * | 6/1979 | Avery et al. | 438/98 |
| 4,251,285 A | * | 2/1981 | Yoldas et al. | 136/256 |
| 4,566,839 A | * | 1/1986 | Butler | 414/404 |
| 4,939,103 A | * | 7/1990 | Szolgyemy | 438/546 |
| 4,993,559 A | * | 2/1991 | Cota | 211/41.18 |
| 5,595,604 A | * | 1/1997 | Kobayashi et al. | 118/715 |
| 5,704,493 A | * | 1/1998 | Fujikawa et al. | 211/41.16 |
| 5,775,889 A | * | 7/1998 | Kobayashi et al. | 432/18 |

OTHER PUBLICATIONS

Green, Martin A., *Solar Cells*, Prentice–Hall, Inc., p. 109, Dec. 1986.

* cited by examiner

*Primary Examiner*—Alan Diamond
(74) *Attorney, Agent, or Firm*—Miles & Stockbridge P.C.

(57) ABSTRACT

To form an impurity diffusion layer on only one side of a semiconductor substrate at least one semiconductor substrate and at least one diffusion protecting plate are put close to each other and a first impurity diffusion is perfomed on them, or at least one semiconductor substrate and at least one diffusion protecting plate are put close to each other and a first impurity diffusion is performed on them and then the semiconductor substrate and the diffusion protecting plate are arranged such that those sides on which the impurity diffusion has been performed face each other and a second impurity diffusion is performed. The diffusion protecting plate may be replaced by a semiconductor substrate. The first and second impurity diffusions may be performed using an impurity of the same conductivity type.

11 Claims, 17 Drawing Sheets

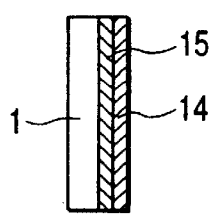
PRIOR ART
FIG. 4A
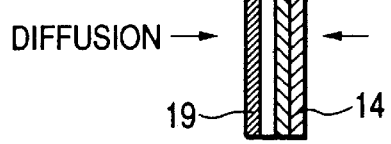
PRIOR ART
FIG. 4B
FIG. 4E
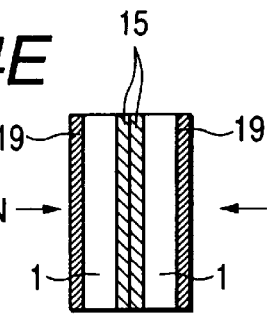
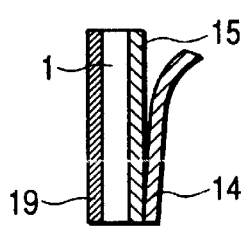
PRIOR ART
FIG. 4C
PRIOR ART
FIG. 4D
FIG. 4F
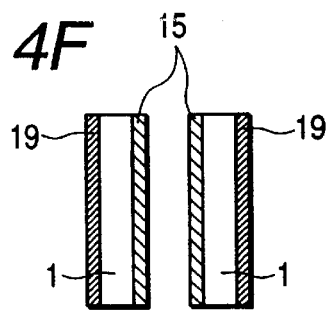
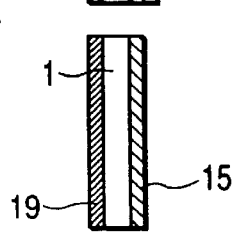
FIG. 5
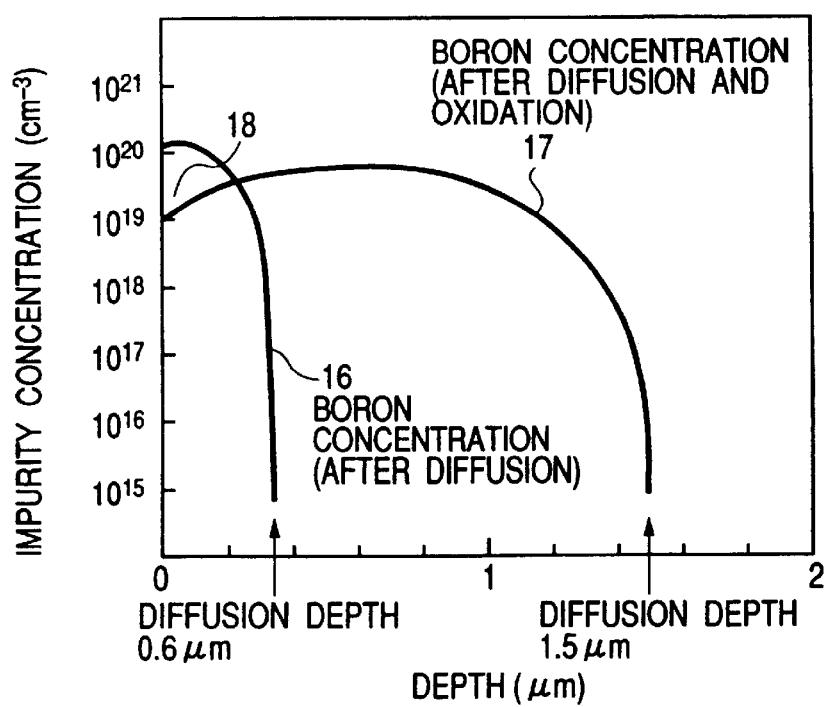

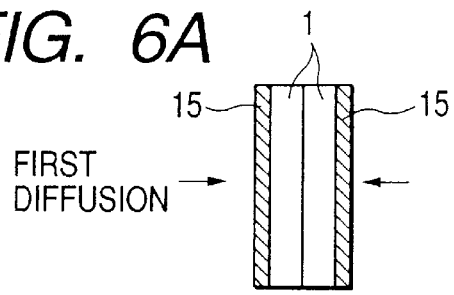
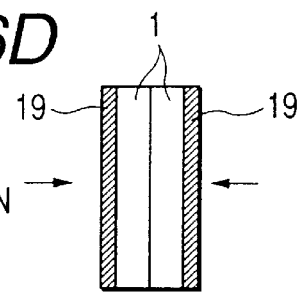
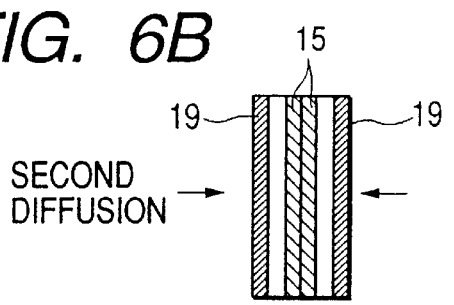
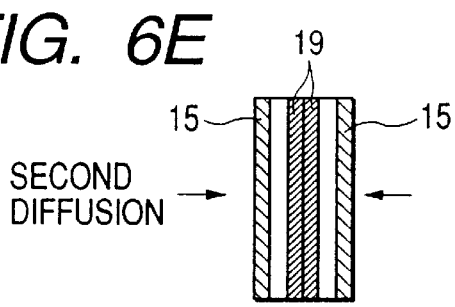
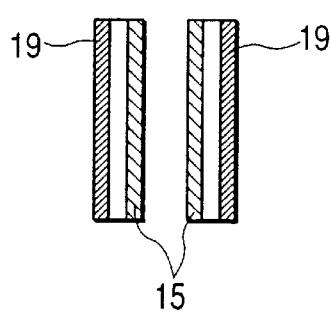
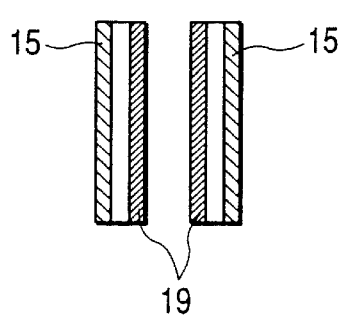
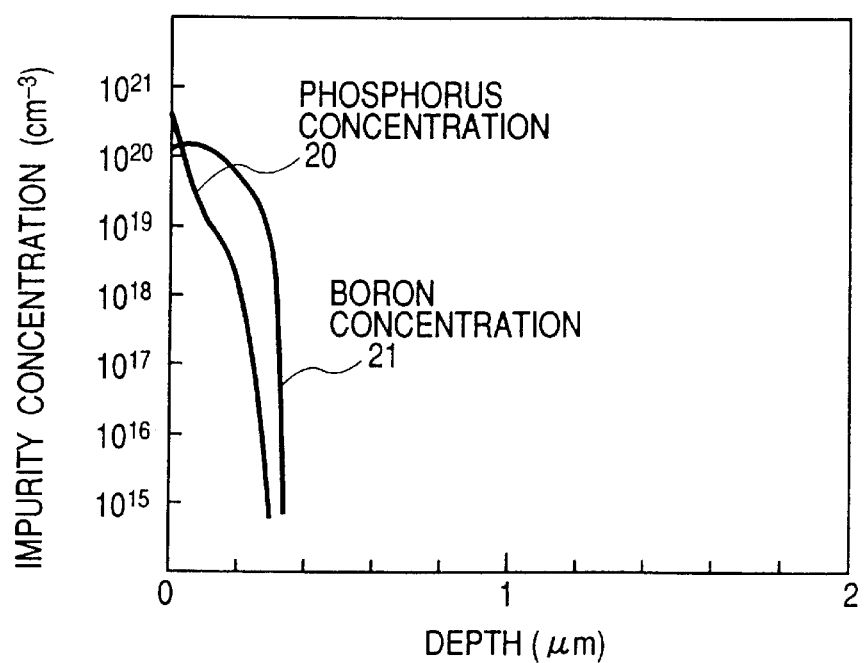

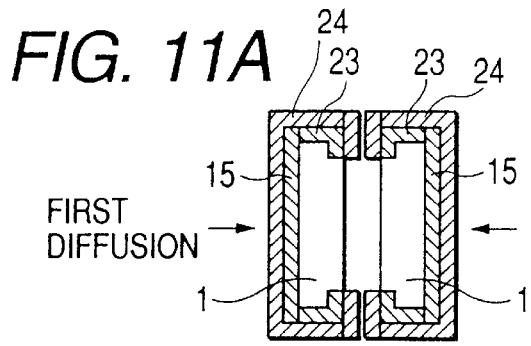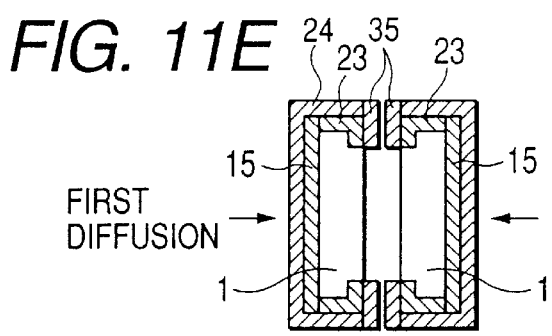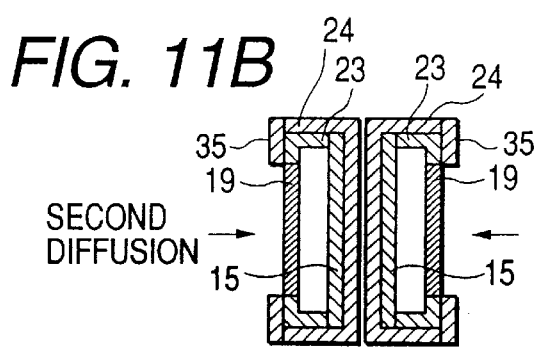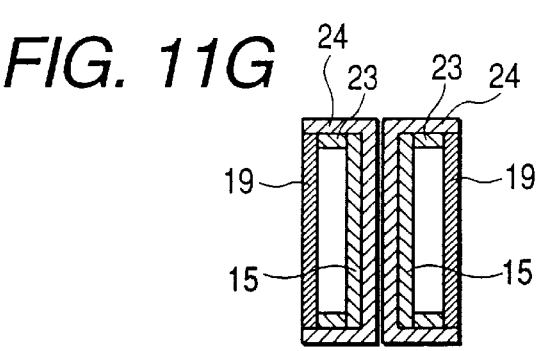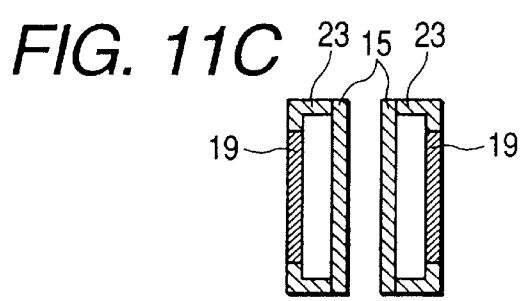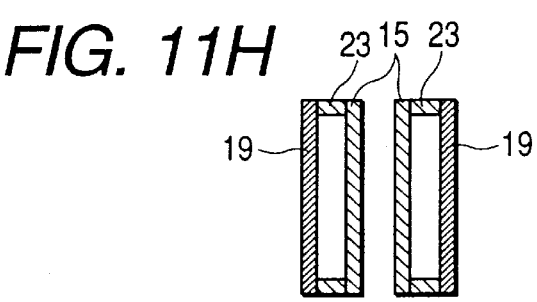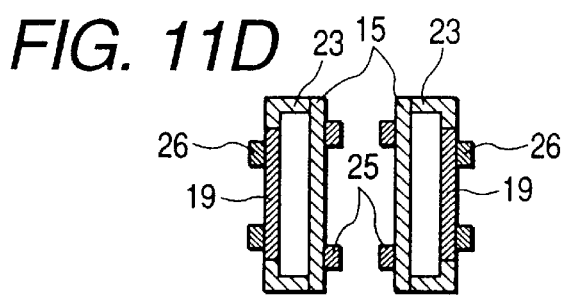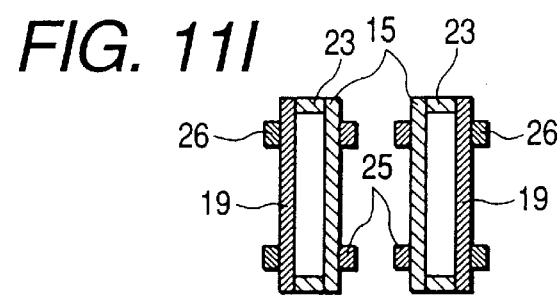

FIG. 19A
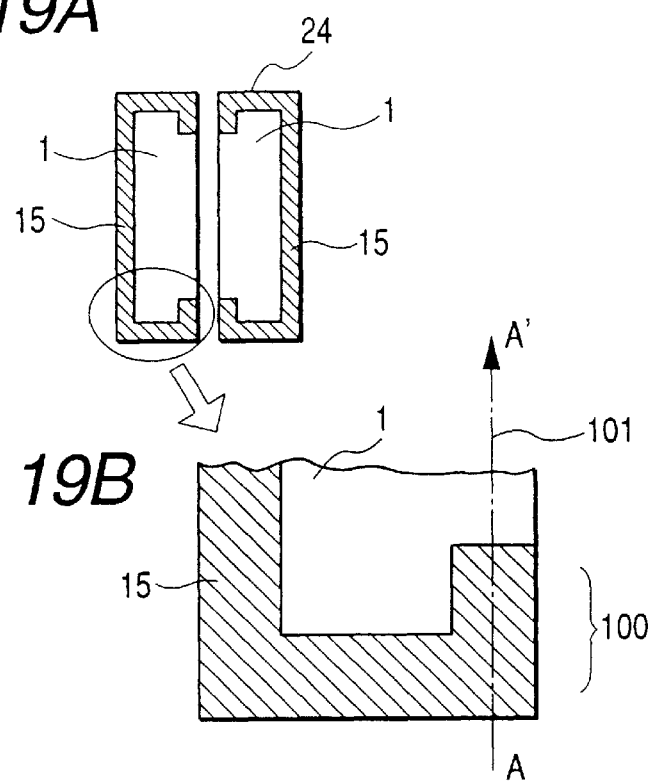
FIG. 19B
FIG. 19C
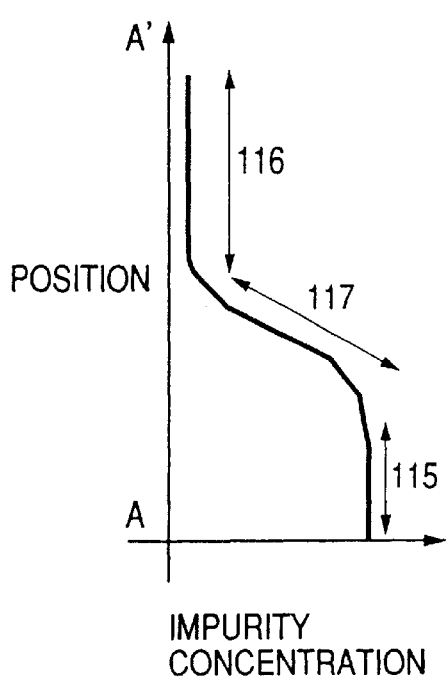
FIG. 19D
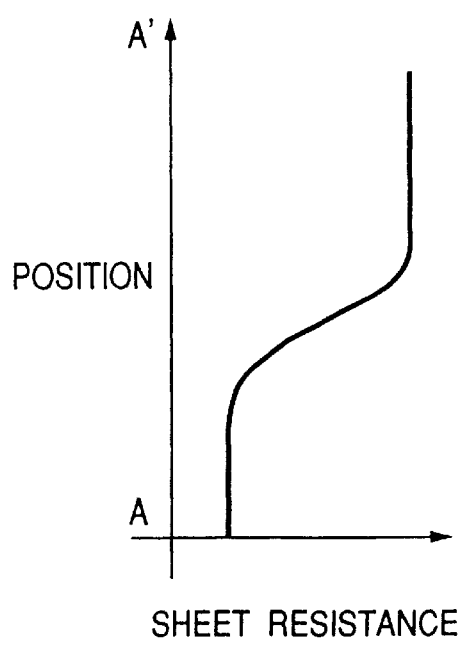

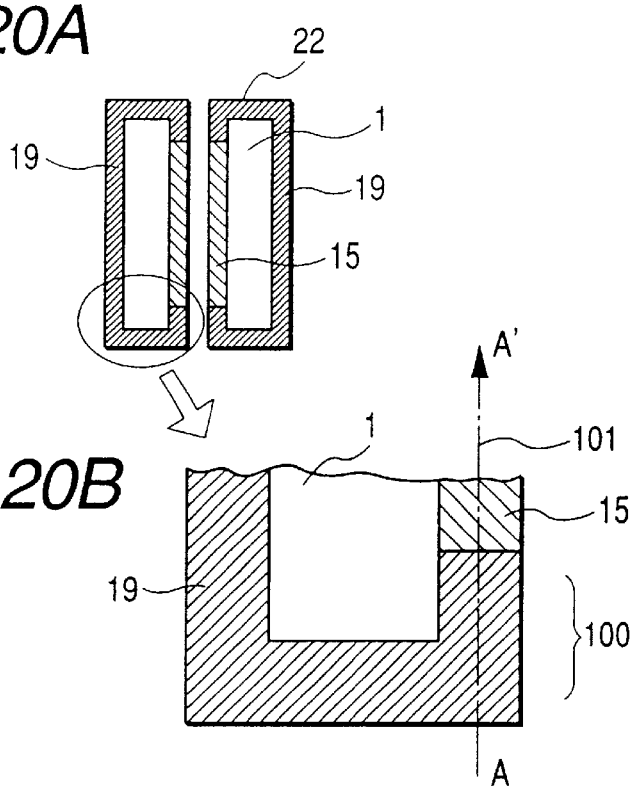
FIG. 20A
FIG. 20B
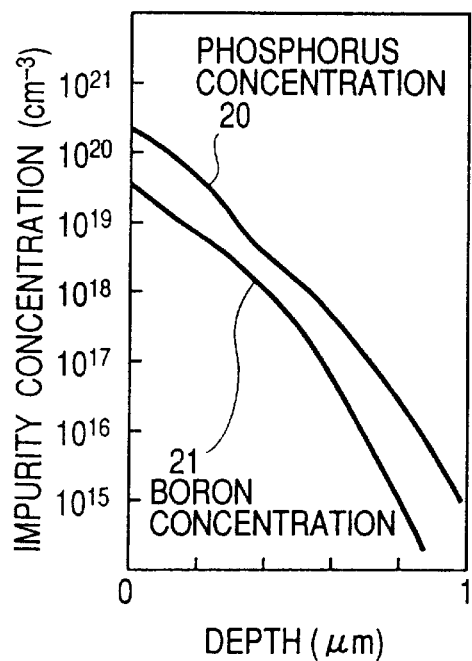
FIG. 21A
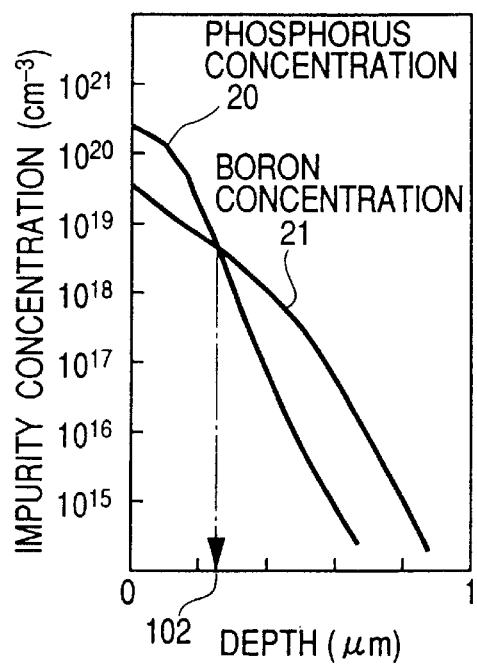
FIG. 21B

PHOTOVOLTAIC DEVICE AND MAKING OF THE SAME

BACKGROUND OF THE INVENTION

The present invention relates to a photovoltaic device and a process for production of said photovoltaic device, said process employing a diffusion protecting plate.

Production of photovoltaic devices involves the diffusion of an impurity. One process for diffusion is disclosed in, for example, "Solar Cells" by Martin A. Green, issued by Prentice-Hall Inc., p. 109, FIGS. 6.4, 6.5(a), and 6.5(b). According to this process, a plurality of semiconductor substrates are arranged at certain intervals in a quartz furnace tube so that the semiconductor substrates are uniformly exposed to an impurity gas. In this process, the impurity is phosphorus and the semiconductor substrate is silicon, and the diffusion to make an impurity layer that exhibits the n-conductivity type is carried out by heating at 800–900° C. The disadvantage of this process is that the diffusion of the impurity takes place on both sides of the semiconductor substrate as shown in FIG. 6.5(a) cited above. (This figure corresponds to FIG. 18C in the present specification.)

SUMMARY OF THE INVENTION

In the case where it is desirable to form the impurity diffusion layer on only one side of the semiconductor substrate, as shown in FIG. 6.5(b) cited above, the conventional process for impurity diffusion suffers a disadvantage of requiring a complex procedure. That is, it is necessary to previously form, prior to diffusion, an anti-diffusion film 14 on one side of the semiconductor substrate, as shown in FIG. 18B. This anti-diffusion film is a thermal CVD nitride film or thermal oxide film or a nitride film or oxide film formed at low temperatures by plasma CVD. Alternatively, it is necessary to diffuse an impurity into both sides of the semiconductor substrate and subsequently remove the diffusion layer on one side by etching or mechanical grinding. These additional steps for anti-diffusion film and etching increase the production cost of photovoltaic devices. Moreover, heat treatment at high temperatures for thermal oxidation deteriorates the quality of the semiconductor substrate, for example, decreasing the lifetime of minority carriers. Also, heat treatment brings about impurity redistribution diffusion, thereby altering the impurity profile. The resulting photovoltaic devices are poor in photoelectric conversion efficiency due to improper impurity profiles. In addition, etching and mechanical grinding change the surface state of the semiconductor substrate. The resulting photovoltaic devices are poor in photoelectric conversion efficiency because the surface texture to prevent light reflection is deformed.

In order to solve the above-mentioned problems encountered in the conventional technology, the present inventors carried out a series of researches. As the result, it was found that the problems are solved if impurity diffusion is carried out according to any of the following processes.

A process in which a first stage of impurity diffusion is carried out in such a way that at least one semiconductor substrate and at least one diffusion protecting plate are put close to each other.

A process in which a first stage of impurity diffusion is carried out in such a way that at least one semiconductor substrate and at least one diffusion protecting plate are put close to each other and subsequently a second stage of impurity diffusion is carried out in such a way that said semiconductor substrate and said diffusion protecting plate are put close to each other, with the side which has undergone diffusion facing inside.

A process in which the diffusion protecting plate is a semiconductor substrate.

A process in which impurities of the same conductivity type are used in the first and second stages of impurity diffusion.

BRIEF DESCRIPTION OF THE DRAWINGS

FIGS. 4A–4D is a diagram showing a conventional process and FIGS. 4E–4F showing one process for producing the photovoltaic device according to the present invention.

FIG. 5 is a diagram showing one process for producing the photovoltaic device according to the present invention.

FIGS. 6A–6F is a diagram showing one process for producing the photovoltaic device according to the present invention.

FIG. 7 is a diagram showing one process for producing the photovoltaic device according to the present invention.

FIGS. 11A–11I is a diagram showing one process for producing the photovoltaic device according to the present invention.

FIGS. 19A–19D is a diagram showing one structure of the photovoltaic device according to the present invention.

FIGS. 20A and 20B is a diagram showing one structure of the photovoltaic device according to the present invention.

FIGS. 21A and 21B is a diagram showing one structure of the photovoltaic device according to the present invention.

DESCRIPTION OF THE PREFERRED EMBODIMENTS

EXAMPLE 1

Figure 1A:
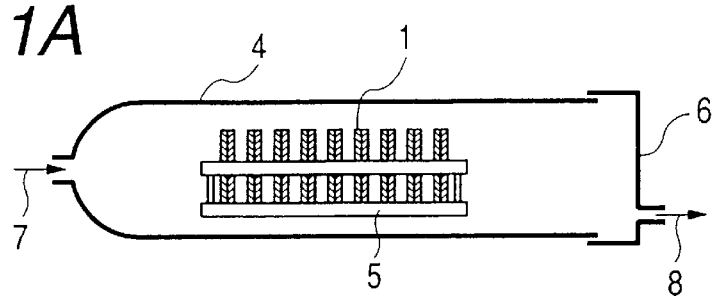
FIGS. 1A–1G is a diagram showing one process for producing the photovoltaic device according to the present invention.
Figure 1B:
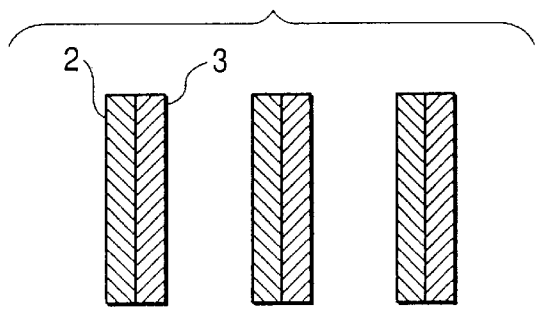
Figure 1C:
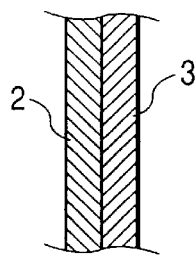
Figure 1D:
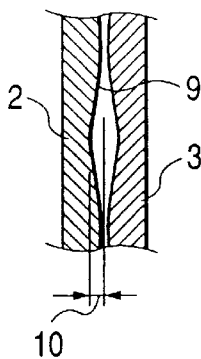
Figure 1E:
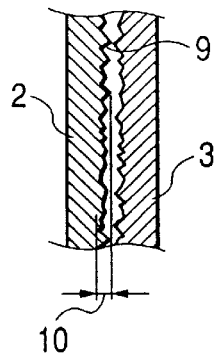
Figure 1F:
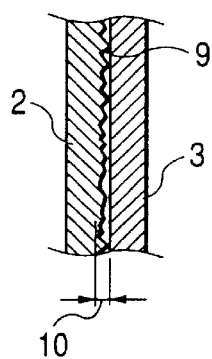
Figure 1G:
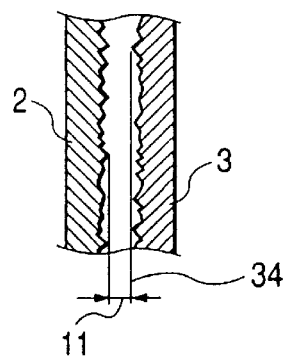

This example demonstrates a process for diffusion as shown in FIGS. 1A–1G. FIG. 1A shows semiconductor substrates 1 placed on a boat 5, every two facing each other. The semiconductor substrates 1 and the boat 5 are placed in a furnace tube 4 (which is an ordinary one used for production of semiconductors). The furnace tube receives a carrier gas 7 through its one end and discharges an exhaust gas 8 through a cap 6 at its another end. FIG. 1B is an enlarged view of the semiconductor substrates 1 in the furnace tube. It is to be noted that a first semiconductor substrate 2 and a second semiconductor substrate 3 are put close to each other in pairs. This arrangement permits only the outer sides of the first and second semiconductor substrates to be exposed to the carrier gas 7. Thus it is possible to diffuse a first impurity to only the outer sides if the carrier gas 7 is mixed with a desired impurity and kept at a prescribed temperature. The first and second semiconductor substrates 2 and 3 should be put completely close to each other as shown in FIG. 1C so as to perfectly prevent the impurity from entering the gap between them. However, there is an instance where the two semiconductor substrates 2 and 3 facing each other cannot be separated from each other or can be separated from each other only with difficulties after diffusion. This trouble is due to the fact that some impurity forms diffusion glass at the part in contact with the carrier gas or a trace amount of carrier gas enters a gap between the two semiconductor substrates with warpage. Such an instance is effectively avoided if the surface 9 of the semiconductor substrate 2 is curved as shown in FIG. 1D or made irregular as shown in FIG. 1E. The function of surface irregularities is produced by minute pyramids ordinarily formed for reflection prevention. The same effect as above is also produced if one of the two semiconductor substrates has surface irregularities or surface curvature, as shown in FIG. 1F. It is possible to prevent the two semiconductor substrates from sticking to each other if the height 10 of the curve or surface irregularities is greater than 2 $\mu$m. The two semiconductor substrates should be put close to each other such that the distance 11 between them is smaller than 1 mm; otherwise, the surfaces facing each other are attacked by the impurity of the first conductivity type. The foregoing demonstrates the diffusion of an impurity into the surfaces of two semiconductor substrates. The diffusion in this manner yields two semiconductor substrates simultaneously, each having one side implanted with an impurity. This process may be modified such that the second semiconductor substrate 3 is a dummy substrate which protects the back side of the first semiconductor substrate 2 from diffusion of an impurity. The dummy substrate may be replaced by a simple diffusion protecting plate made of any material other than semiconductor.

The above-mentioned process for impurity diffusion makes it possible to form an impurity diffusion layer on only one side of the semiconductor substrate by one step of diffusion without requiring a diffusion protecting film (such as thermal oxide) previously formed on one side the semiconductor substrate or without requiring diffusion on both sides and subsequent etching or mechanical grinding to remove the diffusion layer on one side. Therefore, it obviates the necessity of thermal oxide film or etching and hence reduces the number of steps for production of photovoltaic devices. The reduced number of times for heat treatment for thermal oxidation prevents the decrease of the lifetime of minority carriers in the semiconductor substrate. The absence of etching or mechanical grinding keeps intact the surface state of the semiconductor substrate. This means that the texture formed to prevent light reflection remains unbroken and the resulting photovoltaic device keeps a high photoelectric conversion efficiency.

The semiconductor substrate mentioned above may be that of silicon, germanium, or gallium arsenide in the form of single crystal or polycrystal. It may be round or square. It may have the i-, p-, or n-conductivity type. The impurity includes phosphorus, arsenic, antimony, boron, aluminum, and gallium. The impurity as the source of diffusion is usually a liquid or solid compound. For example, phosphorus is used in the form of $POCl_3$. This compound is mixed with a carrier gas (which is a mixture of nitrogen and oxygen) to be introduced into the furnace tube. Phosphorus is also used in the form of a solid prepared by coating a quartz or SiC substrate with $P_2O_5$. Phosphorus is also used in the form of $PH_3$ gas. Boron is used in the form of $BBr_3$, which is mixed with a carrier gas (which is a mixture of nitrogen and oxygen). Boron is also used in the form of BN (solid) or $B_2H_6$ (gas).

EXAMPLE 2

Figure 2:
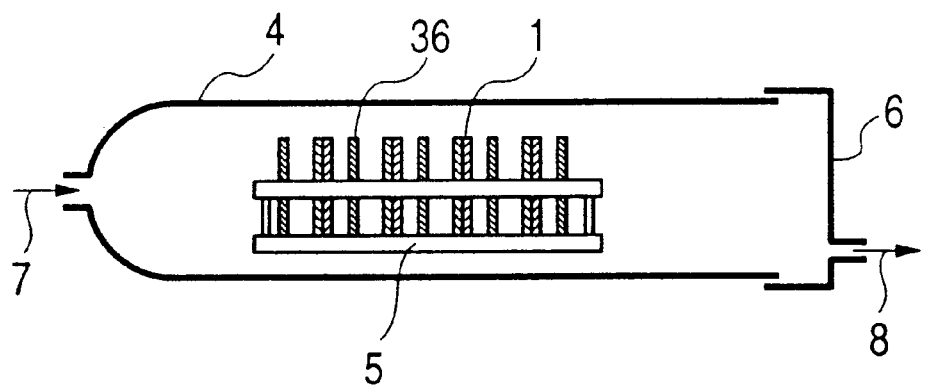
FIG. 2 is a diagram showing one process for producing the photovoltaic device according to the present invention.

This example demonstrates a process for diffusion as shown in FIG. 2. In this example, the source of impurity for diffusion is a solid 36. This solid source does not contain halogen gas, such as Cl and Br, which is contained in the above-mentioned liquid source. The advantage of the halogen-free solid source is that its exhaust gas 8 can be discharged as such to the atmosphere, which contributes to the reduction of the installation cost. Halogen-containing exhaust gas poses problems with apparatus corrosion and human health and air pollution. This necessitates the installation of halogen recovery unit.

The disadvantage of a halogen-containing source is that the treated semiconductor substrate contains a large number of halogen atoms. When a thermal oxide film is formed on the surface of the semiconductor substrate, halogen atoms present in the vicinity of the interface between the semiconductor and the oxide film promote recombination of minority carriers in the interface, thereby decreasing the photoelectric conversion efficiency of the photovoltaic device. This is not true in the case of photovoltaic devices produced by the process which employs a halogen-free solid diffusion source. In this case the semiconductor substrate contains very few halogen atoms which have originally been present before the processing of the semiconductor substrate. Therefore, such halogen atoms do not adversely affect the photoelectric conversion efficiency.

EXAMPLE 3

Figure 3:
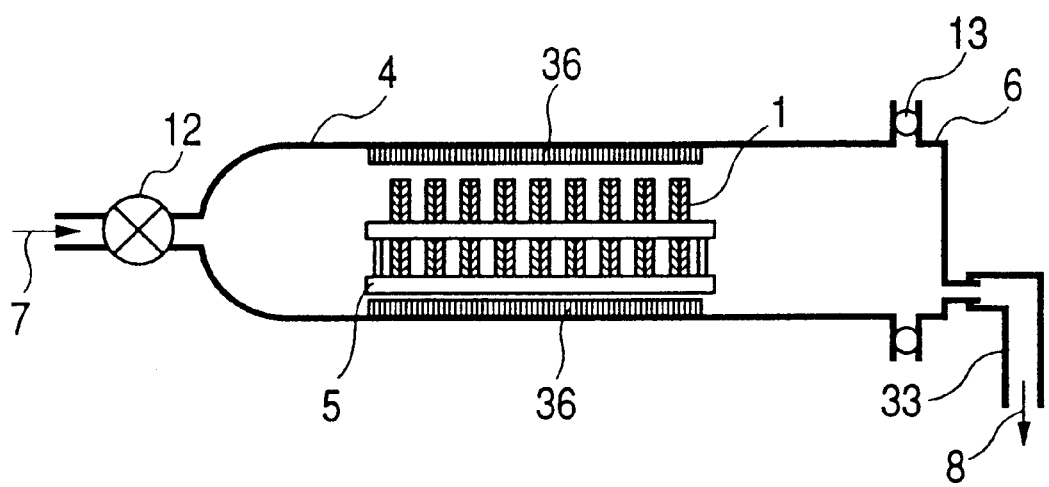
FIG. 3 is a diagram showing one process for producing the photovoltaic device according to the present invention.

This example demonstrates a process for diffusion as shown in FIG. 3. In this example, the diffusion of impurity is accomplished by the low-pressuredistribution diffusion method. According to this method, an impurity is introduced into the furnace tube to which is connected an exhaust tube 33 leading to a vacuum pump (not shown). During operation the valve 12 is closed to stop or restrict the flow of the gas 7 into the furnace tube 4. The gap between the furnace tube 4 and the cap 6 is sealed with the packing 13. The solid diffusion source 36 used in this example may be omitted if a carrier gas containing an impurity is introduced into the furnace tube. The advantage of the low-pressuredistribution diffusion method is that the impurity spreads uniformly in the evacuated furnace tube and hence diffuses uniformly into the surface of the semiconductor substrate 1. In addition, this method prevents or reduces the diffusion of harmful impurities into the semiconductor substrate. Harmful impurities are heavy metals which cause defects to the semiconductor substrate and decrease the lifetime of minority carriers. This effect is remarkable particularly in the case where boron is used as an impurity. The diffusion of boron needs a high temperature of 1000-1100° C., at which the semiconductor substrate is liable to deteriorate due to the diffusion of harmful impurities. The photovoltaic device produced by this method maintains the high quality of the semiconductor substrate, particularly the carrier lifetime, and hence retains the high photoelectric conversion efficiency.

In the case of diffusion with boron as an impurity, heat treatment that follows diffusion might greatly decrease the carrier lifetime. This trouble is avoided if the above-mentioned low-pressuredistribution diffusion method is combined with the diffusion method of the present invention which does not need the diffusion protecting film (such as thermal oxide film). The combination of two methods obviates the necessity of heat treatment except for heat treatment for impurity diffusion. Thus the resulting photovoltaic device has a high photoelectric conversion efficiency.

The above-mentioned low-pressuredistribution diffusion method produces its effect when it is combined with the diffusion method of the present invention. However, it also produces its effect of improving the photoelectric conversion efficiency of photovoltaic devices when it is combined with the ordinary diffusion method. A solid source for boron diffusion is a plate of BN joined together with a binder. The disadvantage of this solid source is that the lifetime of minority carriers in the silicon substrate after impurity diffusion is reduced by more than half from that before impurity diffusion. To be concrete, a silicon substrate having a resistivity of 10 Ω·cm (produced by the CZ method) changes after boron diffusion such that the lifetime of minority carriers decreases from 100 $\mu$s (initial value) to 10 $\mu$s. The solid diffusion source mentioned above usually contains more than 1 ppm of alkali metals (such as Li, Na, and K) as well as more than 10 ppm of other metals (such as Cr, Mn, Fe, Ni, and Cu).

The diffusion source of pyrolytic boron nitride (PBN), which is prepared by thermal CVD, contains only less than 1 ppm of alkali metal (such as Na). It also contains only less than 1 ppm of metals (such as Mn, Fe, Ni, and Cu) A high-purity solid diffusion source such as this gives rise to a silicon substrate in which the lifetime of minority carriers is greater than 50% of that before impurity diffusion. To be concrete, a silicon substrate having a resistivity of 10 Ω·cm (produced by the CZ method) changes very little after boron diffusion, with the lifetime of minority carriers remaining at about 100 $\mu$s (initial value) However, there might be an instance in which the lifetime of minority carriers changes after diffusion if the diffusion source is handled inadequately.

High-purity $BBr_3$ liquid may be used as a source of impurity diffusion. It contains only less than 10 ppb of alkali metals (such as Li, Na, and K). In addition, it contains only less than 20 ppb of V-Group elements, such as As and Bi, and it contains only less than 20 ppb of III-Group elements, such as Al and Ga. It contains only less than 20 ppb of other metals (such as Cr, Co, Cu, Au, Fe, Pb, Hg, Ni, Sn, Ti, Zn, Mg, Mn, and Ag) and other impurities (such as Sr and Ca). A high-purity liquid diffusion source such as this gives rise to a silicon substrate in which the lifetime of minority carriers is greater than 50% of that before impurity diffusion. To be concrete, a silicon substrate having a resistivity of 10 Ω·cm (produced by the CZ method) changes very little after boron diffusion, with the lifetime of minority carriers remaining at about 100 $\mu$s (initial value). However, reproducibility is poor and there are many instances in which the lifetime of minority carriers is smaller than that given above.

As mentioned above, a source for impurity diffusion with a high content of impurity atoms other than those necessary for diffusion decreases the lifetime of minority carriers. However, a high-purity source for impurity diffusion does not necessarily keep the lifetime of minority carriers constant at all times.

By contrast, the low-pressuredistribution diffusion method mentioned above gives rise to a silicon substrate in which the lifetime of minority carriers is greater than 50% of that beforeredistribution diffusion even though a platy solid diffusion source of BN joined together with a binder is employed. Such a solid diffusion source has a high concentration of impurities other than those necessary for diffusion. To be concrete, a silicon substrate having a resistivity of 10 Ω·cm (produced by the CZ method) changes very little after boron diffusion, with the lifetime of minority carriers invariably remaining at about 100 $\mu$s (initial value).

The low-pressuredistribution diffusion method mentioned above almost invariably affords a long lifetime of minority carriers even though the source used for diffusion is a solid source of pyrolytic boron nitride or a liquid source of $BBr_3$, the former containing only less than 1 ppm of major impurities other than the impurity for diffusion, the latter containing only less than 20 ppb of major impurities other than the impurity for diffusion.

The increased lifetime of minority carriers mentioned above is an important factor to increase the photoelectric conversion efficiency of photovoltaic devices. It extends the diffusion length of minority carriers to at least twice (preferably three times) the thickness of the semiconductor substrate, thereby increasing the generated current in photovoltaic devices. This leads to a high photoelectric conversion efficiency.

EXAMPLE 4

This example demonstrates a process for diffusion as shown in FIGS. 4A–4F and 5. In this example, the semiconductor substrate 1 has on one side thereof a layer 15 formed by the first diffusion of impurity and also has on the other side thereof a layer 19 formed by the second diffusion of impurity. FIGS. 4A–4D shows a sample prepared by the conventional process. FIGS. 4E and 4F shows a sample prepared by the process of the present invention. According to the conventional process as shown in FIGS. 4A–4D, the layer 15 formed by the first diffusion is covered with the diffusion protecting film 14 by thermal oxidation, which protects the layer 15 from impurity diffusion by the second diffusion. After the second diffusion, the diffusion protecting film 14 is removed by etching. The thermal oxidation is accomplished at about 900-1000° C. and the resulting thermal oxide film has a thickness of about 0.1 µm. In the case where the first diffusion employs boron as an impurity, the heat treatment to form the oxide film changes the boron concentration profile (in the direction perpendicular to the surface of the semiconductor substrate 1) as shown in FIG. 5. The curve 16 represents the profile before the oxide film is formed, and the curve 17 represents the profile after the oxide film has been formed. It is noted that, after oxidation, the diffusion depth at which the boron concentration equals the impurity concentration in the semiconductor substrate 1 gets deeper and the maximum impurity concentration decreases. In the case of photovoltaic devices designed such that the boron diffusion layer is exposed to solar radiation, it is necessary to reduce the depth of the boron diffusion layer so that the photovoltaic devices are sensitive to short-wavelength light. As compared with the photovoltaic device prepared by the conventional method involving the second diffusion of impurity as shown FIGS. 4A–4D, the one prepared by the method as shown in FIGS. 4E and 4F has a higher photoelectric conversion efficiency because of the shallow boron diffusion depth and hence the high sensitivity to shortwave radiation.

The profile 17 in FIG. 5 indicates that thermal oxidation produces a gradient of boron concentration in the surface layer of the substrate, with the result that the boron concentration in the outermost surface layer of the substrate is lower than one half the maximum concentration. The gradient of the impurity concentration which decreases in going toward the surface increases the recombination of minority carriers in the surface layer of the substrate, which lowers the photoelectric conversion efficiency. The process shown in FIGS. 4E and 4F gives rise to an impurity profile free of gradient; therefore, it contributes to the photoelectric conversion efficiency of photovoltaic devices.

The diffusion of phosphorus is usually carried out at 750–900° C. Consequently, heat treatment at temperatures higher than 750° C. to form the diffusion protecting film 14 changes the concentration profile of impurity (phosphorus), with the diffusion depth increasing, if the layer 15 formed by the first diffusion contains phosphorus as an impurity. This lowers the photoelectric conversion efficiency of photovoltaic devices as in the case mentioned above. Therefore, the process of diffusion according to the present invention, which obviates the necessity of the diffusion protecting film 14 (such as thermal oxide film) formed at temperatures higher than 750° C., contributes to the photoelectric conversion efficiency of photovoltaic devices.

EXAMPLE 5

This example demonstrates the diffusion process according to the present invention as shown in FIGS. 6A–6F, 7, 8 and 9A–9F. The diffusion process in this example is carried out in two stages. In the first stage, the first impurity diffusion layer is formed on one side of a silicon semiconductor substrate. In the second stage, the second impurity diffusion layer is formed on the other side of the semiconductor substrate. The first diffusion employs boron as an impurity, and the second diffusion employs phosphorus as an impurity. In the process shown in FIGS. 6A–6C, the first diffusion of boron is carried out to form the first impurity diffusion layer 15, with two semiconductor substrates 1 put close to each other. Subsequently, the two semiconductor substrates are reversed and put close to each other. The second diffusion for phosphorus is carried out to form the second impurity diffusion layer 19. In this way it is possible to produce easily the semiconductor substrate which has on one side thereof a p-type diffusion layer and on the other side thereof an n-type diffusion layer.

Figure 8:
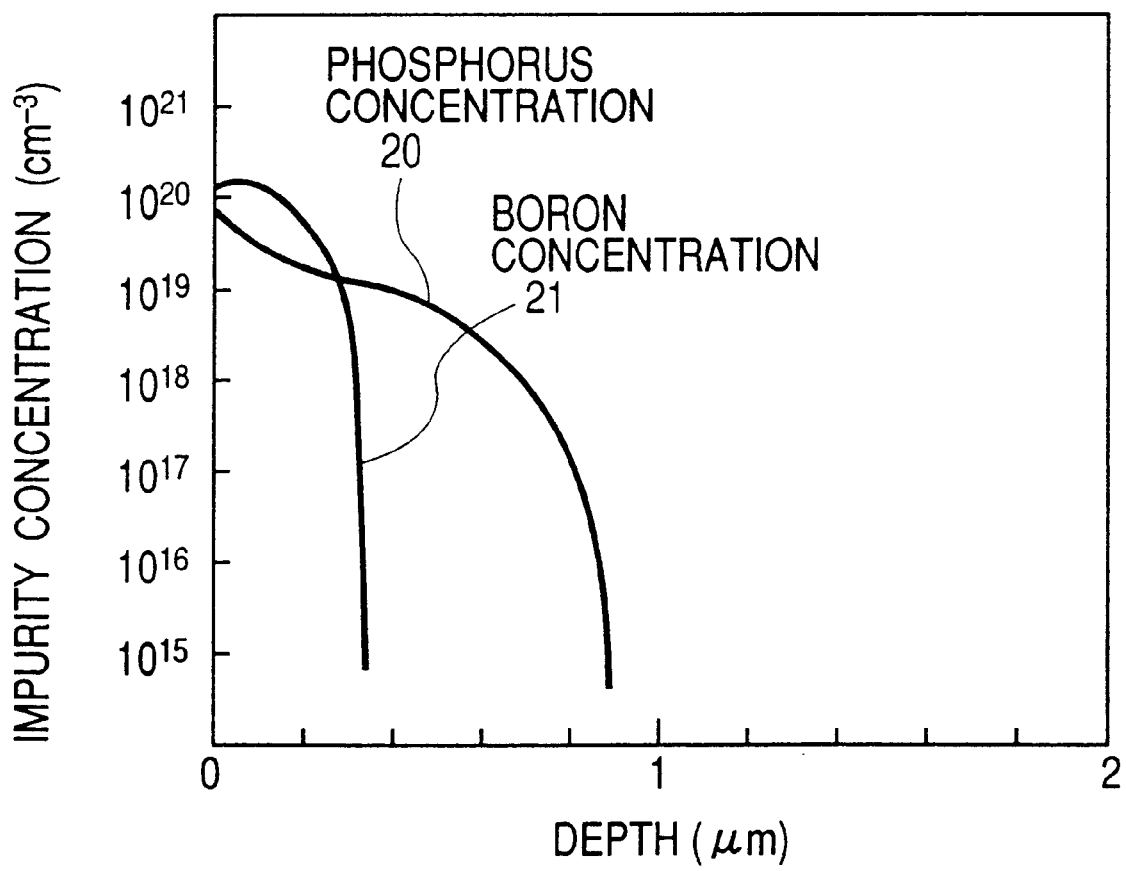
FIG. 8 is a diagram showing one process for producing the photovoltaic device according to the present invention.

The process shown in FIGS. 6D–6F differs from the process shown in FIGS. 6A–6C in that the impurities used in the first and second diffusion are exchanged with each other. In this way it is possible to produce the semiconductor substrate which has the same structure of diffusion layers as that produced by the process shown in FIGS. 6A–6C. However, the impurity diffusion layers obtained by these two processes differ from each other in the impurity concentration profile. The semiconductor substrate produced by the process shown in FIGS. 6A–6C has a phosphorus concentration profile and a boron concentration profile as shown in FIG. 7. In this process, the diffusion of boron is carried out first at 1000-1100° C. and then the diffusion of phosphorus is carried out at 750–900° C. The boron concentration profile resulting from the first diffusion is hardly affected by the second diffusion of phosphorus which is carried out at a lower temperature than the first diffusion of boron. Therefore, in the case where the diffusion of boron is carried out such that the diffusion depth is about 0.35 µm and the diffusion of phosphorus is carried out such that the diffusion depth is about 0.3 µm, these diffusion depths remain unchanged as indicated by the boron concentration curve 21 and the phosphorus concentration curve 20 in FIG. 7 even after the first and second diffusions have been completed. By contrast, in the case of diffusion by the process shown in FIGS. 6D–6F, the phosphorus diffused first is redistributed by the high-temperature heat treatment for the second diffusion. Therefore, thephosphorus concentration profile 20 becomes deeper as shown in FIG. 8. The increased diffusion depth lowers the sensitivity to the solar radiation incident to the phosphorus diffusion surface of the semiconductor substrate. Thus the resulting photovoltaic device has a low photoelectric conversion efficiency. Thus the process shown in FIGS. 6A–6C, which is designed to carry out the diffusion of boron first, is superior to the process shown in FIGS. 6D–6F. In other words, if the first and second diffusions are to be carried out by the process of the present invention, it is desirable that the diffusion at a higher temperature should be carried out first. Also, in the case where the first diffusion takes longer or shorter than the second diffusion, the one which takes longer should be carried out first for the same reason as mentioned above, because the longer the diffusion takes, the greater becomes the diffusion depth.

The above-mentioned process for impurity diffusion makes it possible to produce a semiconductor substrate having impurity diffusion layers of different conductivity type on each side thereof by performing the impurity diffusion only twice, without requiring a diffusion protecting film (thermal oxide film) on one side of the semiconductor substrate or requiring etching or mechanical grinding to remove one of the diffusion layers formed on both sides of the semiconductor substrate. The effect of this process is the reduction of such steps as thermal oxidation and etching required to produce photovoltaic devices. The reduction of the number of times of high-temperature heat treatment (such as thermal oxidation) prevents the decrease of the lifetime of minority carriers in the semiconductor substrate. The absence of etching and mechanical grinding avoids the change of the surface state of the semiconductor substrate, while keeping intact the texture to prevent light reflection. This prevents the decrease of the photoelectric conversion efficiency due to decrease in function to prevent light reflection.

Figure 9A:
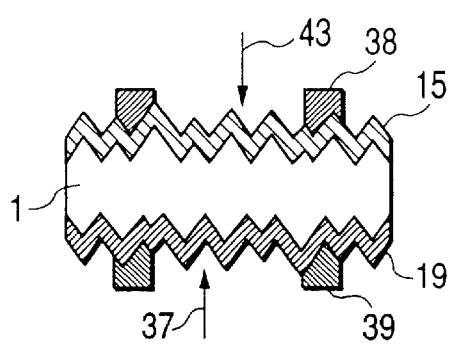
FIGS. 9A–9F is a diagram showing one process for producing the photovoltaic device according to the present invention.
Figure 9B:
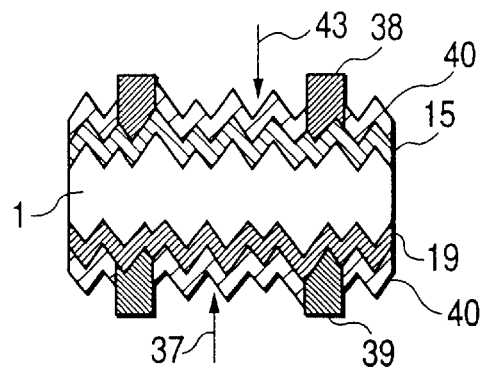
Figure 9C:
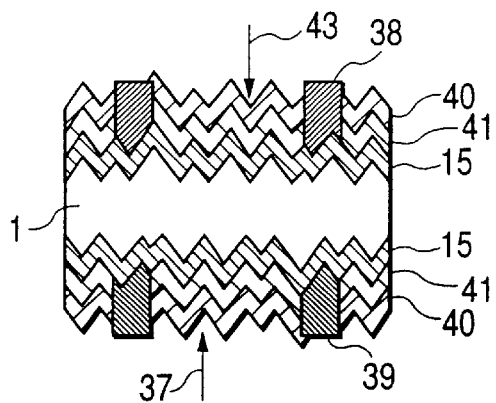
Figure 9D:
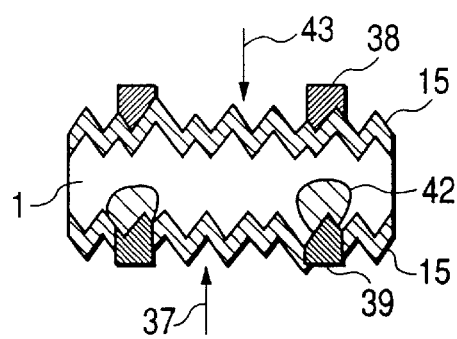
Figure 9E:
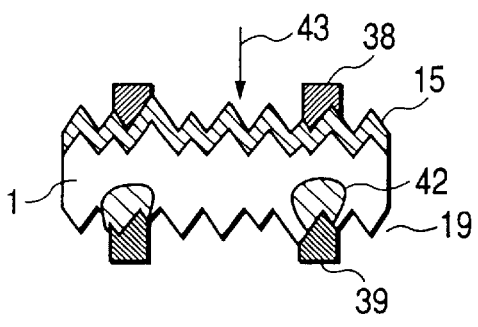
Figure 9F:
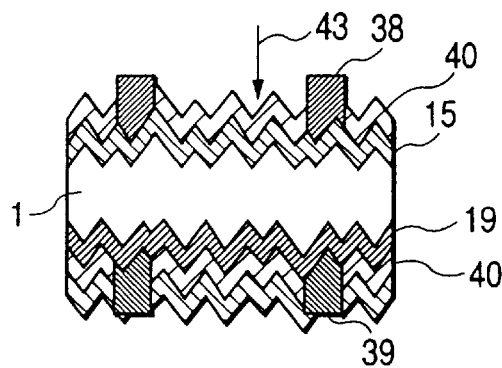

The semiconductor substrate prepared by the above-mentioned process is provided with front electrodes 38 and rear electrodes 39 by the ordinary method as shown in FIG. 9A. In this way it is possible to produce easily a photovoltaic device capable of generating electric current upon irradiation with the incident light 43 on the front surface and the incident light 37 on the rear surface. The front surface and rear surface are provided with an anti-reflection film 40 of dielectric material, as shown in FIG. 9B. The anti-reflection film in conjunction with the anti-reflection structure (which is minute irregularities formed on the surface of the semiconductor substrate 1) effectively catch the incident light. Needless to say, even a semiconductor substrate having a flat surface without minute irregularities can produce the same effect as mentioned above, as a matter of course. The semiconductor substrate is provided with a passivation film 41, which is oxide film or silicon nitride film, as shown in FIG. 9C. This passivation film reduces the recombination of minority carriers and increases the photoelectric conversion efficiency. The semiconductor substrate having the structure as shown in FIG. 9B is provided with electrodes on the entire rear surface thereof as shown in FIG. 9F, so that the resulting photovoltaic device is capable of generating electric current only with the incident light on the front surface. The semiconductor substrate may be provided with a BSF layer 42 by aluminum alloying at the part where the electrode 39 comes into contact with the substrate 1 without passing through the first and second impurity diffusion layers 15 and 19, as shown in FIGS. 9E and 9D. The BSF layer 42 has a conductivity type opposite to that of the diffusion layer 15 of the first conductivity type, and it also has a higher impurity concentration than that of the opposite conductivity type of the semiconductor substrate 1. This structure helps reduce the rate of recombination of minority carriers at the interface between the electrode 39 and the substrate 1 and hence increases the photoelectric conversion efficiency.

The process explained above consists of the first diffusion to form a boron diffusion layer of p-type and the second diffusion to form a phosphorus diffusion layer of n-type. The same process as explained above may be used to perform the first and second diffusions on the front and rear sides of the semiconductor substrate also in the case where the first and second impurity diffusion layers are of the same conductivity type but vary in the impurity concentration and diffusion depth. The resulting semiconductor substrate has the first and second impurity diffusion layers having the same conductivity type and varying in the impurity concentration and diffusion depth, as shown in FIG. 9D. This semiconductor substrate can be produced easily by only two steps of diffusion.

FIGS. 9A–9F merely show some typical examples of structure. Many other kinds of structure are available in which the diffusion layer, anti-reflection layer, passivation layer, BSF layer, electrodes, and direction of incident light are variously combined. Whatever the structure, the above-mentioned process for producing impurity diffusion layers gives rise to photovoltaic devices having a high photoelectric conversion efficiency.

EXAMPLE 6

Figure 10A:
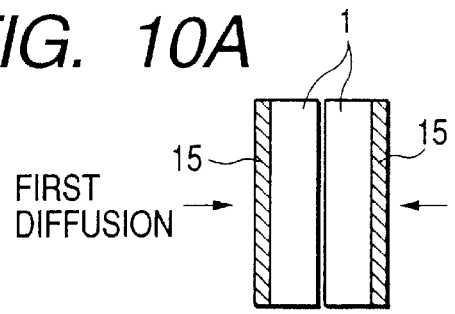
FIGS. 10A–10F is a diagram showing one process for producing the photovoltaic device according to the present invention.
Figure 10D:
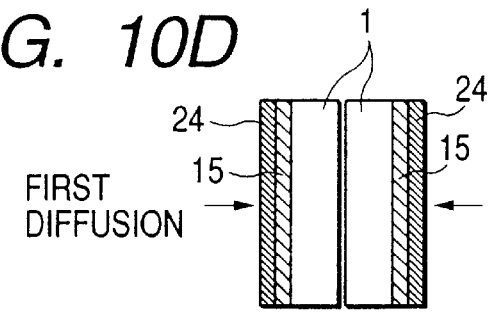
Figure 10B:
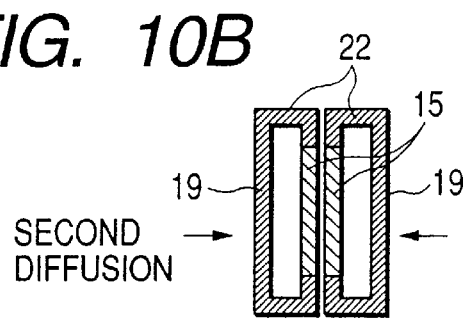
Figure 10E:
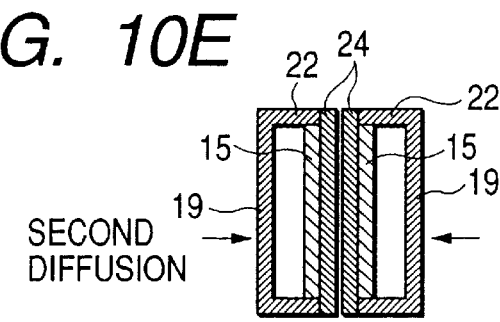
Figure 10C:
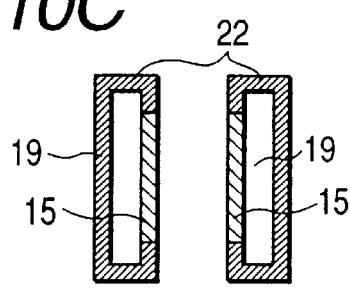
Figure 10F:
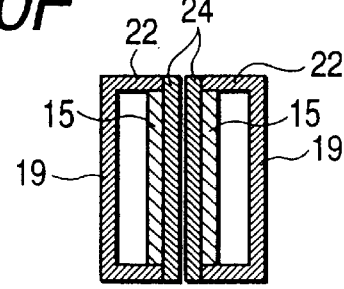
Figure 12A:
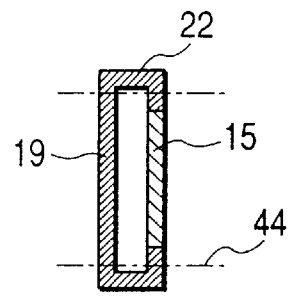
FIGS. 12A–12D is a diagram showing one process for producing the photovoltaic device according to the present invention.
Figure 12B:
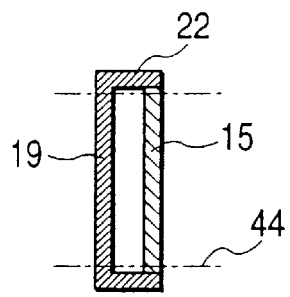
Figure 12C:
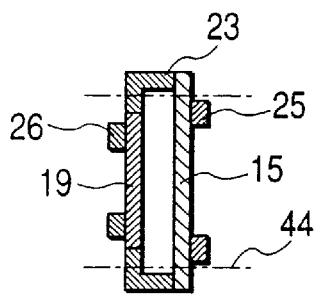
Figure 12D:
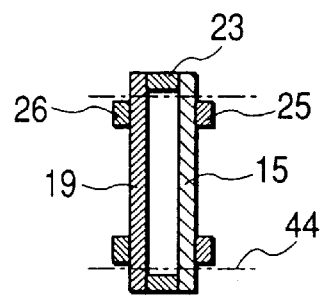

This example demonstrates the diffusion process according to the present invention as shown in FIGS. 10A–10F. In this example, the second diffusion is carried out such that a small amount of diffusion gas gets into the inner surfaces of the semiconductor substrates 1 put close to each other. The impurity diffusion layer formed in this way is indicated by 22 in FIGS. 10B–10C. The part 22 decreases the area of the first diffusion layer 15 and hence decreases the area of the semiconductor substrate necessary for the photovoltaic device. This shortcoming is avoided if the impurity glass 24 formed by the first diffusion is left and utilized as the diffusion protecting film in the second diffusion as shown in FIGS. 10D–10F. The result of this procedure is that the diffused layer 22 does not get into the inner layers facing each other and hence the entire surface of the semiconductor substrate 1 can be used for the photovoltaic device.

Another advantage of the above-mentioned procedure is that the impurity glass 24 formed by the first diffusion functions as the diffusion protecting film for the second diffusion even in the case where a small amount of diffusion gas enters the gap between the inner layers facing each other during the second diffusion. Thus the diffusion protecting film prevents the second impurity from getting into the first impurity diffusion layer 15.

In this example, it is not essential to use the diffusion process according to the present invention for the first diffusion. It is permissible to use the ordinary diffusion method that employs etching (to be performed on one side after diffusion) or a thermal oxide film for diffusion protection. What is important is that the impurity diffusion glass formed by the first diffusion is left when the second diffusion is carried out.

EXAMPLE 7

This example demonstrates that diffusion process according to the present invention as shown in FIGS. 11A–11I. The procedure in this example is designed to cope with the situation in which the creeping part 23 occurs in the first diffusion layer during the first diffusion. Thus it is possible to prevent the area of the first impurity diffusion layer 15 from decreasing as shown in FIGS. 11A–11D if the second diffusion is carried out without removing the first impurity glass 24 formed in the first diffusion as in Example 6 mentioned above. However, in this case, the creeping part 23 of the first diffusion layer has already been formed by the first diffusion and hence the second diffusion layer 19 formed by the second diffusion has decreased in area. In order to cope with this situation, etching is performed on the diffusion glass after the first diffusion so as to remove the creeping part 35 of the first impurity glass formed by the first diffusion, as shown in FIGS. 11E–11I. Subsequently, the second diffusion is carried out. In this way it is possible to form the second diffusion layer 19 on the entire surface of one side of the semiconductor substrate as shown in FIGS. 11F–11I. The advantage of this structure is that the second electrodes 26 shown in FIG. 11I are closer to the outer edge of the semiconductor substrate than those shown in FIG. 11D when they are formed by the step shown in FIGS. 11D and 11I. The resulting photovoltaic device has a larger effective area for the same area of the semiconductor substrate.

EXAMPLE 8

This example demonstrates the diffusion process according to the present invention as shown in FIGS. 12A–12D. The procedure in this example includes the step of removing the creeping part 22 or 23 of the diffusion layer which gets into the edge of the semiconductor substrate 1 or the layers facing each other, in the same way as explained with reference to FIGS. 10A–10F and 11A–11I. One way to remove the creeping part 22 or 23 is by etching or grinding. This object is achieved simply by cutting (such as dicing and laser cutting) along the cutting line 44.

EXAMPLE 9

Figure 13A:
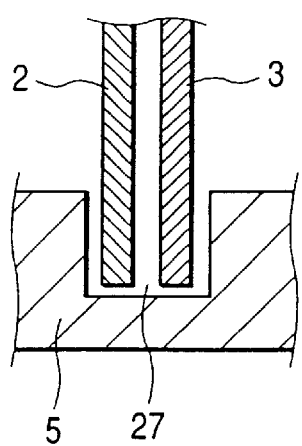
FIGS. 13A and 13B is a diagram showing one process for producing the photovoltaic device according to the present invention.
Figure 13B:
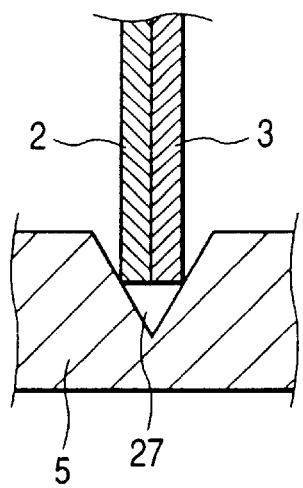

This example demonstrates the diffusion process according to the present invention as shown in FIGS. 13A and 13B.

The disadvantage of diffusion performed on two semiconductor substrates 2 and 3 which are put close to each other in a boat 5 is that a gap occurs between them if the boat holding them has a groove 27 as shown in FIG. 13A. This disadvantage is overcome by using a boat with a groove whose walls are inclined as shown in FIG. 13B. In this way it is possible to eliminate the gap between the two semiconductor substrates 2 and 3.

EXAMPLE 10

Figure 14A:
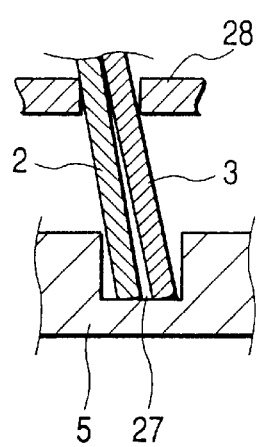
FIGS. 14A–14C is a diagram showing one process for producing the photovoltaic device according to the present invention.
Figure 14B:
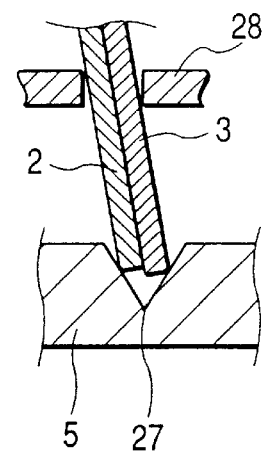
Figure 14C:
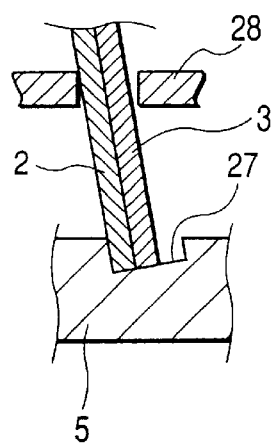

This example demonstrates the diffusion process according to the present invention as shown in FIGS. 14A–14C. The procedure in this example is characterized in using a boat whose upper groove 28 is displaced sideward relative to the lower groove 27. The two semiconductor substrates 2 and 3 are put close to each other by means of these grooves so that the gap between them is eliminated. The effect of eliminating the gap is enhanced if the lower groove has inclined walls as shown in FIG. 14B. The same object as above is also achieved if the lower groove 27 is slightly inclined so that the wall of the groove parallels the inclined semiconductor substrates 2 and 3, as shown in FIG. 14C.

EXAMPLE 11

Figure 15A:
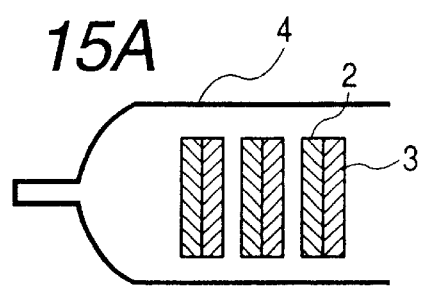
FIGS. 15A–15C is a diagram showing one process for producing the photovoltaic device according to the present invention.
Figure 15B:
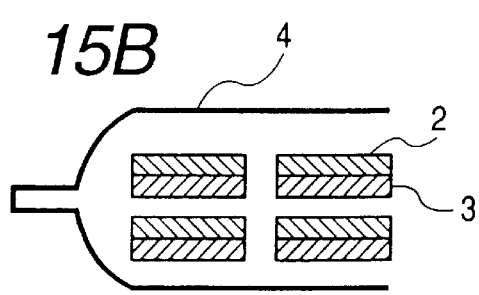
Figure 15C:
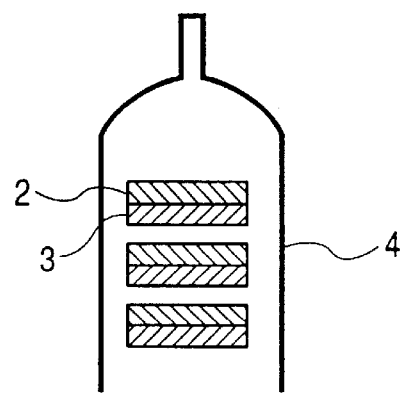

This example demonstrates the diffusion process according to the present invention as shown in FIGS. 15A–15C. In the case of ordinary diffusion, the furnace tube 4 is held horizontal and the semiconductor substrates 2 and 3 are arranged vertical, as shown in FIG. 15A. Diffusion in this manner requires a contrivance to eliminate the gap between the semiconductor substrates 2 and 3, as mentioned in Examples 9 and 10 above. However, it is possible to eliminate the gap easily if the two semiconductor substrates 2 and 3 are placed horizontally one over the other as shown in FIG. 15B. The same object as above is also achieved if a vertical furnace tube 4 is used and semiconductor substrates are arranged horizontally in it, as shown in FIG. 15C. In this way it is possible to place more semiconductor substrates in a furnace tube of the same diameter than in the case shown in FIG. 15B.

EXAMPLE 12

Figure 16A:
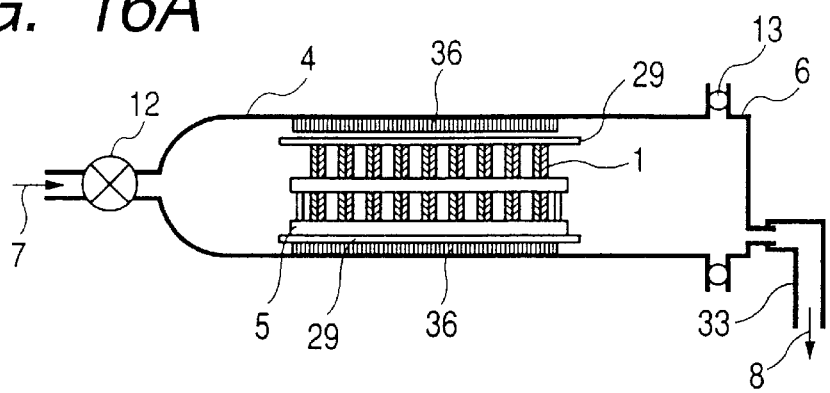
FIGS. 16A and 16B is a diagram showing one process for producing the photovoltaic device according to the present invention.
Figure 16B:
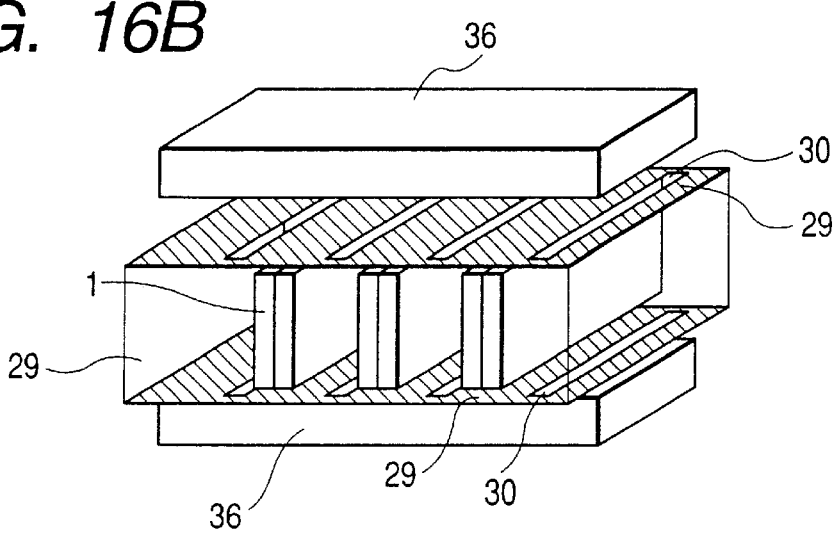

This example demonstrates the diffusion process according to the present invention as shown in FIGS. 16A and 16B. Diffusion in this example is based on the low-pressuredistribution diffusion method explained in Example 3. Unlike the normal-pressuredistribution diffusion, the low-pressuredistribution diffusion takes place in such a way that the impurity from the solid diffusion source 36 reaches the semiconductor substrates 2 and 3 directly or after repeated collisions in the furnace tube. Therefore, the process for low-pressuredistribution diffusion employs a diffusion protecting plate 29 placed between the solid diffusion source 36 and the semiconductor substrates 2 and 3. The diffusion protecting plate 29 has slits 30. The position of each slit corresponds to the open space between two adjacent pairs of the semiconductor substrates 2 and 3. This arrangement prevents the impurity from creeping into the gap between the semiconductor substrates 2 and 3 which are put close to each other. The same effect as mentioned above is produced also in the case where the low-pressuredistribution diffusion process employs a carrier gas containing the desired impurity.

EXAMPLE 13

Figure 17A:
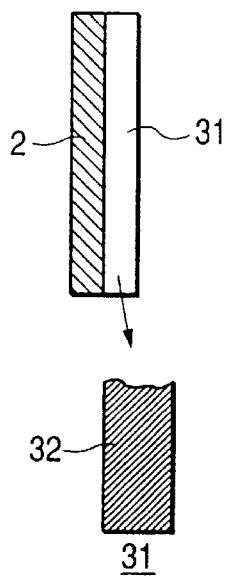
FIGS. 17A–17C is a diagram showing one process for producing the photovoltaic device according to the present invention.
Figure 17B:
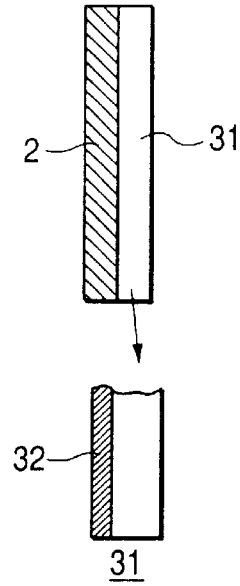
Figure 17C:
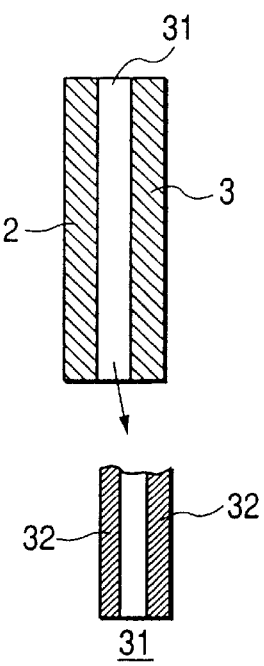
Figure 18A:
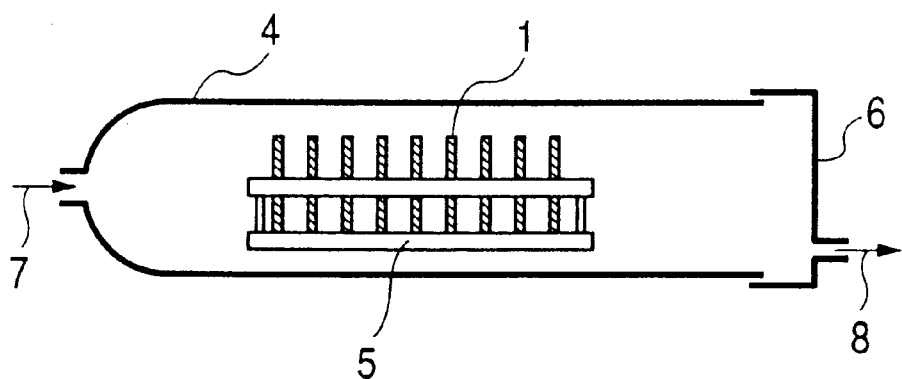
FIGS. 18A–18C is a diagram showing one process for producing the photovoltaic device according to the present invention.
Figure 18B:
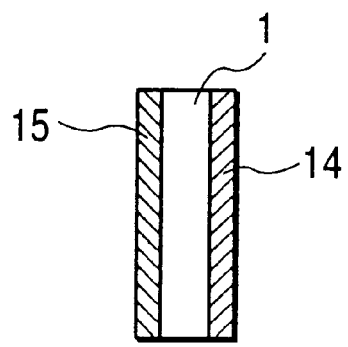
Figure 18C:
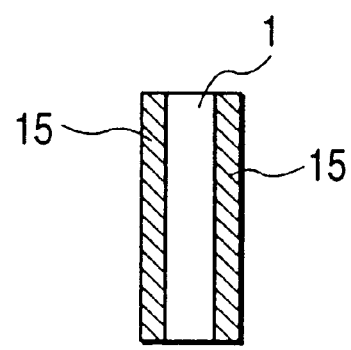

This example demonstrates the diffusion process according to the present invention as shown in FIGS. 17A–17C. In this example, the above-mentioned diffusion process is modified by using the diffusion substrate 31 as a second diffusion source. The advantage of this modification is that it is possible to form a first impurity diffusion layer and a second impurity diffusion layer on the front and rear sides of the semiconductor substrate by a single step of diffusion. To be concrete, the impurity diffusion source substrate 31 is placed on the rear side of the semiconductor substrate 2, as shown in FIG. 17A, in order to form the first conductivity type on the surface of the semiconductor substrate 2 by the diffusion process according to the present invention (in which the two semiconductor substrates are put close to each other). In this way it is possible to form a first impurity diffusion layer and a second impurity diffusion layer on the front and rear sides of the semiconductor substrate by a single step of diffusion. If an appropriate choice is made for the conductivity type and concentration of the impurity contained in the impurity diffusion source substrate, it is possible to form impurity diffusion layers having the identical or different conductivity type on both sides of the semiconductor substrate by a single step of diffusion.

The same effect as mentioned above can be obtained even though the diffusion source layer 32 is formed on only one side of the impurity diffusion source substrate 31 as shown in FIG. 17B. This process may be modified such that the impurity diffusion source substrate 31 (which may have on both sides thereof the diffusion source layer 32 as shown in FIG. 17C) is held between the first and second semiconductor substrates 2 and 3. In this way it is possible to form the impurity diffusion layer of the same structure as above simultaneously on the semiconductor substrates 2 and 3 by using a single impurity diffusion source substrate 31.

The semiconductor substrate mentioned above may be that of silicon, germanium, or gallium arsenide in the form of single crystal or polycrystal. It maybe round or square. It may have the i-, p-, or n-conductivity type. The impurity includes phosphorus, arsenic, antimony, boron, aluminum, and gallium. The impurity as the source of diffusion is usually a liquid or solid compound. For example, phosphorus is used in the form of $POCl_3$. This compound is mixed with a carrier gas (which is a mixture of nitrogen and oxygen) to be introduced into the furnace tube. Phosphorus is also used in the form of a solid prepared by coating a quartz or SiC substrate with $P_2O_5$. Phosphorus is also used in the form of $PH_3$ gas. Boron is used in the form of $BBr_3$, which is mixed with a carrier gas (which is a mixture of nitrogen and oxygen). Boron is also used in the form of BN (solid) or $B_2H_6$ (gas).

The above-mentioned diffusion process (applied to the semiconductor substrates put close to each other) may be applied to photovoltaic devices of many other different structures in which the diffusion layer, anti-reflection layer, passivation layer, BSF layer, electrodes, and direction of incident light are variously combined. The resulting photovoltaic devices have a high photoelectric conversion efficiency.

EXAMPLE 14

The impurity diffusion process that employs a diffusion protecting plate according to the present invention forms on the semiconductor substrate an impurity diffusion layer which has a creeping part in which the impurity concentration distribution varies in going from the peripheral part to the center. For example, if diffusion is performed on two semiconductor substrates put close to each other as shown in FIG. 19A so that a first impurity diffusion layer 15 of the first conductivity type is formed on the first surface, the first impurity diffusion layer 15 creeps into the second surface (opposite to the first surface) to form the creeping part 100 as shown in FIG. 19B, which is a partly enlarged view of FIG. 19A. In this part, the surface concentration of the impurity of the first conductivity type varies in going (along A–A') from the peripheral part to the center of the substrate 1, as shown in FIG. 19C. In part 115, the impurity concentration is high. In part 116, the impurity concentration is low (equal to that in the case where impurity diffusion is not performed). In part 117, the impurity concentration gradually changes. The reason for this is that a small amount of impurity gets into the reverse side even though diffusion is performed by using the diffusion protecting plate placed at the opposite position so that the impurity diffusion layer is formed only on the first surface. How far the impurity gets into varies depending on how the diffusion protecting plate overlaps the substrate 1 or how the impurity diffusion gas flows. No matter how the diffusion protecting plate is arranged, the part of high impurity concentration extends to 1 mm to 10 mm, depending on the condition of impurity diffusion. The distribution of concentration can be determined by measuring the distribution of sheet resistance. In the case where the substrate 1 has the first conductivity type and the first impurity diffusion layer 15 also has the first conductivity type, the concentration of impurity of the first conductivity type in the part 115 having the high impurity concentration is higher than that in the part 116 in which the concentration is equal to the concentration (or the concentration in the substrate) in the case where distribution diffusion is not carried out. Therefore, the sheet resistance in part 115, in which the impurity concentration is high, is low as shown in FIG. 19D. In the case where the first diffusion layer is on the reverse side of the substrate and diffusion of impurity of the second conductivity type (which differs from the conductivity type of the first diffusion layer 15) is performed such that part 100 (in which creeping of impurity occurs) is formed as shown in FIG. 20A and FIG. 20B, the sheet resistance varies in part 115 (in which the impurity concentration is high) and in part 116 (in which the impurity concentration is the same as that without impurity diffusion) depending on their impurity concentration.

As mentioned above, by measuring the sheet resistance of the part in which creeping of impurity occurs, it is possible to observe the distribution of impurity before impurity diffusion in the part where creeping of impurity occurs and the increase or decrease of resistance due to the combination of the conductivity types of impurity diffusion which is performed afterward.

EXAMPLE 15

In the case where the creeping part of the impurity diffusion layer occurs in the reverse side of the diffusion surface of a substrate and the conductivity type of impurity differs in the creeping part on the surface opposite to the diffusion surface and in the part where creeping of impurity does not occur, the electrode for communication with the main surface on the reverse side comes into contact with the creeping part, so that leakage between p-n junction occurs and recombination current increases, deteriorating the electrical properties. Also, the deterioration of electrical properties due to local creeping of impurity or creeping of impurity in extremely low concentrations is noticed even in the part where the creeping part cannot be identified from the resistance measurement or from the color nonuniformity after the oxide film formation which occurs due to difference in the surface concentration of impurity as explained in Example 14.

They are effectively prevented by changing the concentration of impurity in creeping part and the concentration of impurity of conductivity type different from that of said impurity. For example, in the case where n-type phosphorus is diffused into the front side of a substrate and p-type boron is diffused into the rear side by using the diffusion protecting plate, boron gets into the front side to form a p-type creeping layer on the front side, thereby deteriorating the electrical properties. In this case it is possible to prevent the electrical properties from deteriorating by selecting the conditions of impurity diffusion such that the impurity profile near the substrate surface shows that the phosphorus concentration 20 is higher than the boron concentration 21 as shown in FIG. 21A. It is possible to prevent the electrical properties from deteriorating even if the phosphorus concentration 20 is higher than boron concentration 21 only in the area close to the surface as shown in FIG. 21B. In this case, if the depth 102 at which the phosphorus concentration 20 equals the boron concentration 21 is too shallow, the electrode intrudes into the substrate (reaching a depth of about 0.1–0.2 $\mu$m) depending on the conditions under which the electrode is formed on the substrate surface. As the result, the electrode reaches the p-type layer in which the boron concentration is higher than the phosphorus concentration. Consequently, in order to prevent the electrical properties from deteriorating, it is necessary that the depth 102 at which the phosphorus concentration 20 equals the boron concentration 21 should be greater than 0.1 $\mu$m, preferably greater than 0.2 $\mu$m, from the surface of the substrate.

The above-mentioned process for producing photovoltaic devices makes it possible to omit the step of etching, the step of forming the diffusion protecting mask, and the step of diffusion which were employed in the conventional manufacturing process. Therefore, it reduces the production cost for photovoltaic devices and improves the photoelectric conversion efficiency. Also, in the past, for example, in order to form impurity diffusion layers differing from each other in conductivity type on the front side and rear side of a substrate, it was necessary to use steps of applying Al metal, firing it, and removing it by optional etching. Such steps cause cracking during production of photovoltaic devices, which lowers yields. Even though cracking does not occur, chipping and warping occur or small cracking which is hardly detected in appearance inspection also occurs. Photovoltaic devices with such defects cause cracking in the step of making photovoltaic devices into a module, and the resulting module is poor in electrical properties. These pose a problem with low yields in the production of photovoltaic device modules. Particularly in the case of photovoltaic devices thinner than 250 $\mu$m, cracking, chipping, and warping occur frequently and they present difficulties in the production of photovoltaic device modules. In contrast, by using the photovoltaic device modules prepared by the process mentioned above, it is possible to solve the above-mentioned problems, to increase the yields of photovoltaic devices and photovoltaic device modules constructed from them, and to improve their electrical properties. Moreover, for example, as explained above for the conventional technology, it is possible to form the high-concentration p-type impurity diffusion layer of high performance by the impurity diffusion method employing the above-mentioned diffusion protecting plate without forming the Al metal layer to form the p-type impurity diffusion layer almost entirely on the reverse side. Therefore, it is possible to remarkably improve the photoelectric conversion efficiency for the incident light on the rear side.

EXAMPLE 16

Figure 22A:
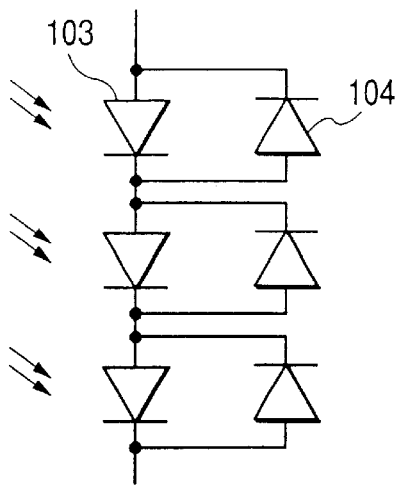
FIGS. 22A and 22B is a diagram showing one structure of the photovoltaic device according to the present invention.
Figure 22B:
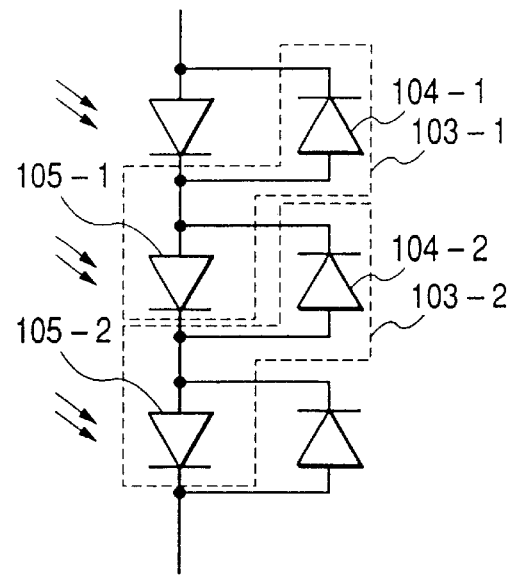

In a photovoltaic device module formed by connecting a plurality of photovoltaic devices with electrical wiring, when one of the photovoltaic devices fails to generate electric power, it becomes impossible to take out power from the group of photovoltaic devices electrically connected in series with the defective photovoltaic device. One known way to prevent this is to connect by-pass diodes 104 in parallel to the photovoltaic devices 103 as shown in FIG. 22A. However, such a photovoltaic device module increases in production cost on account of by-pass diodes and increased steps for connection. Therefore, actual photovoltaic device modules usually employ only one by-pass diode for the entire module rather than many by-pass diodes for individual photovoltaic devices. One way to cope with this situation is to make each photovoltaic device 103 integrally from the by-pass diode 104 and the diode 105 constituting the photovoltaic device proper, as shown in FIG. 22B.

Figure 23A:
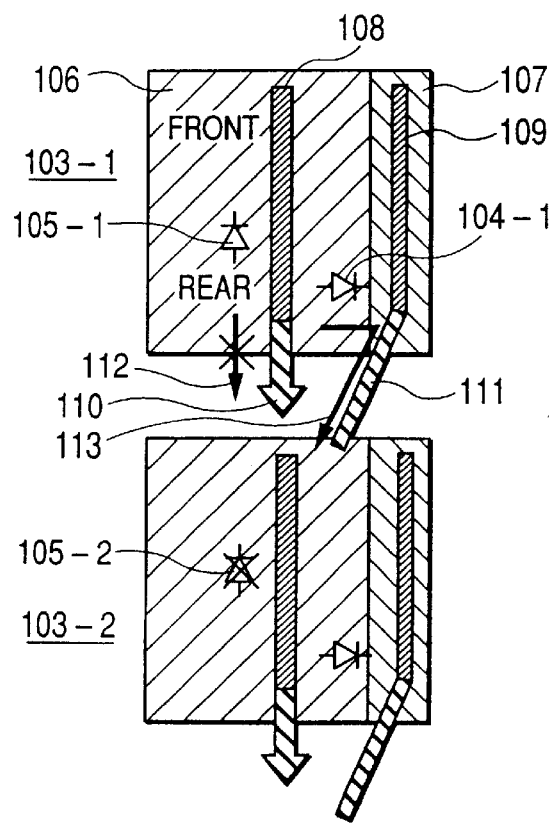
FIGS. 23A and 23B is a diagram showing one structure of the photovoltaic device according to the present invention.

The action of the by-pass diode will be specifically explained with reference to FIGS. 23A and 23B. FIG. 23A shows photovoltaic devices 103-1 and 103-2 connected in series to each other, as viewed from the rear side. Each photovoltaic device has on its rear side a part 106 of the first conductivity type (p-type) and a part 107 of the second conductivity type (n-type) and a first and second electrodes 108 and 109 on parts 106 and 107 respectively. The front side of the photovoltaic device is covered with a layer of the second conductivity type. The part 106 of the first conductivity type on the rear side and the layer of the second conductivity type on the front side constitute the diode 105, and the part 106 of the first conductivity type on the rear side and the part 107 of the second conductivity type on the rear side constitute the by-pass diode 104. Usually, the current generated by the diode 105-2 flows through the wire 110 connecting the front side of the photovoltaic device 103-2 to the rear side of the photovoltaic device 103-1, so that the current 112 flows from one cell to another. In the case where no current flows on account of failure in the photovoltaic device 103-2, the by-pass current 113 flows through the by-pass diode wiring 111 connected to the by-pass diode 104-1 and the part 106 of the first conductivity type on the rear side of the photovoltaic device 103-2. In this way it is possible to take out current generated by the photovoltaic device 103-1 even though the photovoltaic device 103-2 fails.

Figure 23B:
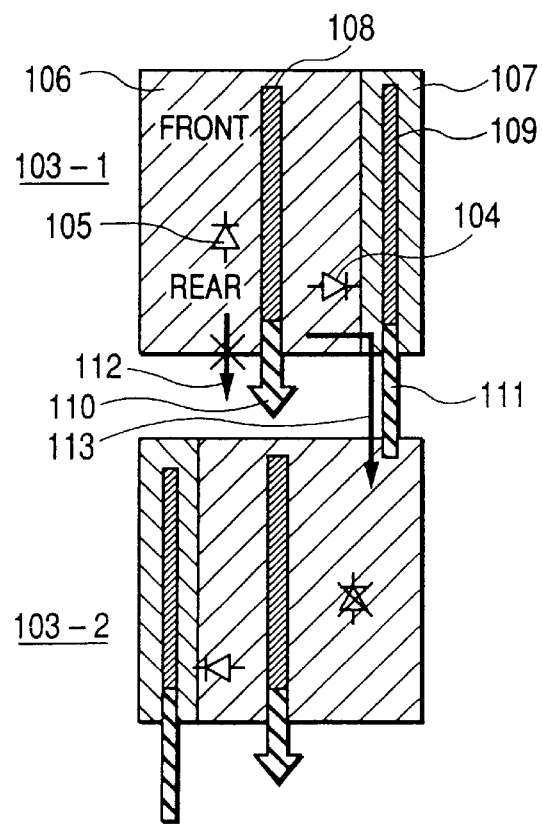

FIG. 23B shows an example in which the arrangement of the photovoltaic devices 103-1 and 103-2 is reversed. In this case it is not necessary to arrange aslant the by-pass diode wiring 111. This facilitates wiring and obviates the necessity of passing the wiring over the part of different conductivity type which is on the same surface of the photovoltaic device, thereby preventing electrical shorts and leakage.

The photovoltaic device having the by-pass diode of the above-mentioned structure is produced in the following manner. First, a thermal oxide film is patterned by ordinary photolithography. Second, the patterned thermal oxide film is used as a diffusion mask to form the part 106 of the first conductivity type and the part 107 of the second conductivity type. Unfortunately, photolithography greatly increases the production cost of photovoltaic devices because it needs expensive many steps.

Figure 24A:
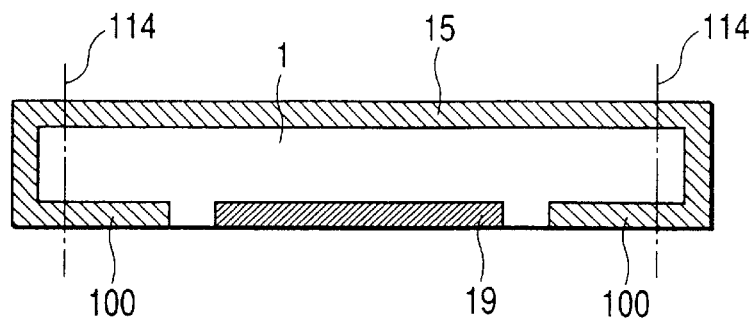
FIGS. 24A–24C is a diagram showing one structure of the photovoltaic device according to the present invention.
Figure 24B:
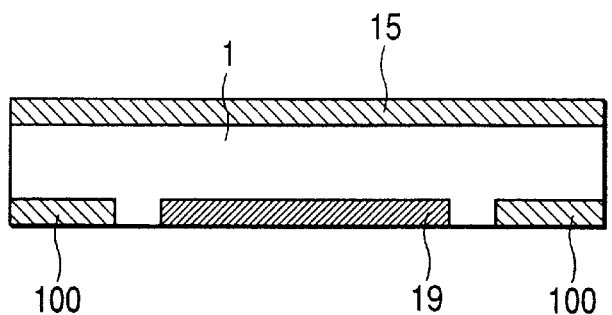
Figure 24C:
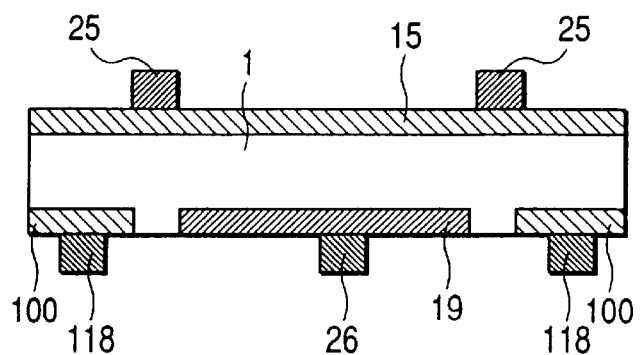

A means to address this problem is explained with reference to FIGS. 24A–24C. First, a first impurity diffusion layer 15 is formed on the first side of the substrate 1, as shown in FIG. 24A, by the diffusion method that employs the diffusion protecting plate as explained above. Then, a second impurity diffusion layer 19 on the second side according to need. Subsequently, the impurity layer which has got into the side of the substrate 1 along the cutting line 114 is removed by etching or grinding. In this way there is obtained the structure shown in FIG. 24B. If necessary, the substrate is provided with a passivation film, an anti-reflection film (not shown), a front electrode 25, and a back electrode 26, which are formed by the ordinary method. In addition, the by-pass diode electrode 118 is formed on the creeping part 100 on the second surface. Thus there is obtained the desired photovoltaic device having a built-in by-pass diode.

EXAMPLE 17

Figure 25A:
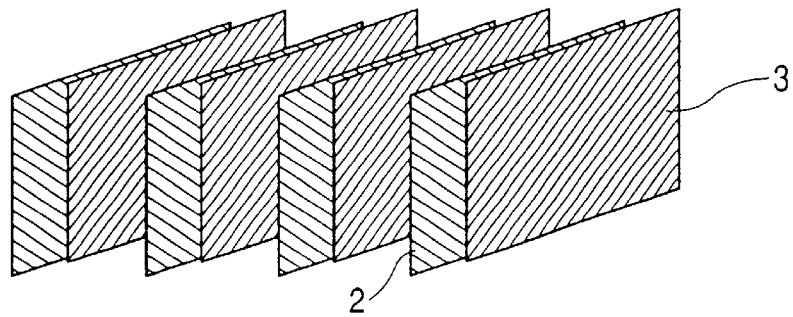
FIGS. 25A and 25B is a diagram showing one structure of the photovoltaic device according to the present invention.
Figure 25B:
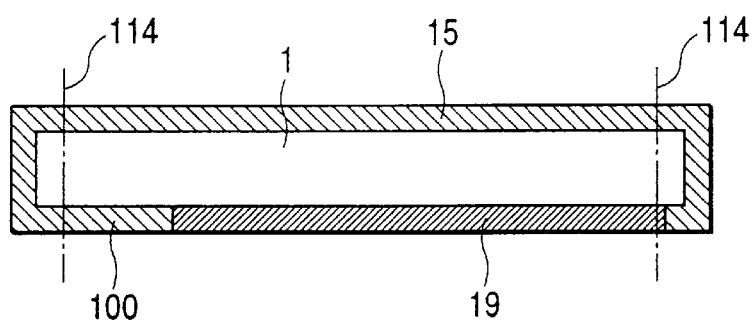

The by-pass diode in Example 16 can be formed with certainty by the method explained below with reference to FIGS. 25A and 25B. According to this method, diffusion of an impurity of the first conductivity type is carried out, with a first semiconductor 2 and a second semiconductor 3 put close to each other and slightly displaced from each other. In this way it is possible to diffuse the impurity of the first conductivity type into the part where the two substrates 2 and 3 do not overlap, as shown in FIG. 25B. This impurity diffusion layer is used as the part 100 extending to the second surface. In this way it is possible to control adequately the shape of the part 100 (to be used as the by-pass diode) and the concentration of impurity.

The forgoing description assumes two substrates of identical shape. However, it is also possible to use two substrates each having a bilaterally asymmetrical shape, which are put close to each other in their different directions. Diffusion under this condition forms the extending part on the part where the two substrates do not overlap. As mentioned above, if diffusion is performed on substrates displaced from each other or substrates having specially contrived shapes, with two substrates put close to each other such that part of the surface of the substrate does not overlap, then it is possible to form on the non-overlapping part the extending part having the controlled impurity concentration. The remaining structure is formed in the same way as in Example 16.

EXAMPLE 18

Figure 26:
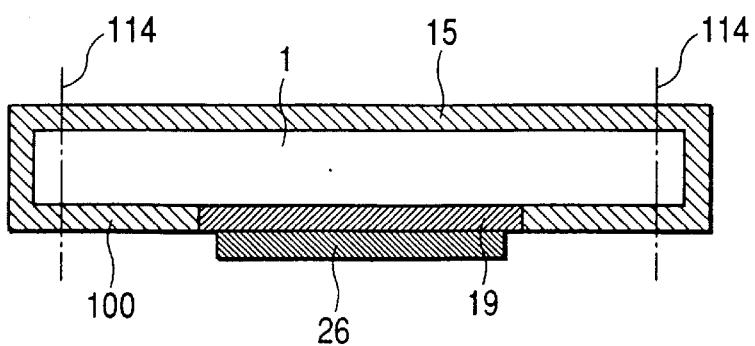
FIG. 26 is a diagram showing one structure of the photovoltaic device according to the present invention.

The structure in Example 16 can be formed by the method explained below with reference to FIG. 26. First, the diffusion layer 15 of impurity of the first conductivity type is formed on both sides of the substrate 1 by the ordinary method for impurity diffusion. An Al electrode 26 is applied to part of the rear side, and then it is fired. Thus there is formed the layer 19 of impurity of the second conductivity type which has a higher impurity concentration than the layer 15 of impurity of the first conductivity type. Then, the diffusion layer at the edge is separated along the cutting line 114. In this way it is possible to form the layer of impurity of the first conductivity type which is electrically insulated from the front side and rear side of the substrate 1. The remaining structure is formed in the same way as in Example 16. As mentioned above, it is possible to build in the by-pass diode by using the diffusion process which permits the impurity to diffuse into the back side of the diffused surface even in the case of the impurity diffusion which does not employ the diffusion protecting plate.

The disadvantage of the photovoltaic device module constructed of conventional photovoltaic devices is that when one of the photovoltaic devices is shaded, the module decreases in output current as much as the shaded photovoltaic device does and hence the output power of the entire module greatly decreases. However, if the photovoltaic device module is constructed of the photovoltaic devices each having the above-mentioned by-pass diode, then the decrease in the output voltage of the module is very small (approximately equal to the decrease in the output voltage of each photovoltaic device), even when one of the photovoltaic devices constituting the module is shaded. Hence, the decrease in the output power of the entire module is very small. In addition, the above-mentioned by-pass diode which is built into the photovoltaic device does not need additional cost for cost for by-pass diode and wiring. Therefore, the photovoltaic device module having the above-mentioned features can be produced at the same production cost as the conventional photovoltaic device module.

What is claimed is:

1. A method of making a photovoltaic device comprising a step of arranging a semiconductor substrate such that its first surface faces a diffusion protecting plate and performing a first impurity diffusion on a second surface of said semiconductor substrate which is opposite to said first surface, and a step of arranging said semiconductor substrate such that its second surface faces a diffusion protecting plate and performing a second impurity diffusion on said first surface of said semiconductor substrate.

2. A method of making a photovoltaic device comprising a step of arranging a first semiconductor substrate and a second semiconductor substrate such that a first surface of said first semiconductor substrate faces a first surface of said second semiconductor substrate and performing a first impurity diffusion on a second surface, which is opposite to said first surface of said first semiconductor substrate, and on a second surface, which is opposite to said first surface of said second semiconductor substrate, and a step of arranging said first semiconductor substrate and said second semiconductor substrate such that said second surface of said first semiconductor substrate faces said second surface of said second semiconductor substrate and performing a second impurity diffusion on said first surface of said first semiconductor substrate and on said first surface of said second semiconductor substrate.

3. A method of making a photovoltaic device as defined in claim 1, wherein an impurity for said first impurity diffusion is boron and an impurity for said second impurity diffusion is phosphorus.

4. A method of making a photovoltaic device comprising arranging a semiconductor substrate such that a first surface thereof faces a diffusion protecting plate, wherein said semiconductor substrate has on the first surface thereof a layer formed by a diffusion of impurity, and performing an impurity diffusion on a second surface of said semiconductor substrate which is opposite to said first surface.

5. A method of making a photovoltaic device comprising arranging a first semiconductor substrate and a second semiconductor substrate such that a first surface of said first semiconductor substrate faces a first surface of said second semiconductor substrate, wherein each semiconductor substrate has on the first surface thereof a layer formed by a diffusion of impurity, and performing a second impurity diffusion on a second surface of said first semiconductor substrate, which is opposite to said first surface of said first semiconductor substrate, and on a second surface of said second semiconductor substrate which is opposite to said first surface of said second semiconductor substrate.

6. A method of making a photovoltaic device comprising arranging a semiconductor substrate such that a first surface thereof faces a diffusion protecting plate, wherein at least one of the facing surfaces of said semiconductor substrate and said diffusion protecting plate has surface irregularities, and performing an impurity diffusion on a second surface of said semiconductor substrate which is opposite to said first surface.

7. A method of making a photovoltaic device as defined in claim 6, wherein said surface irregularities are equal to or greater than 2 $\mu$m.

8. A method of making a photovoltaic device comprising arranging a first semiconductor substrate and a second semiconductor substrate such that a first surface of said first semiconductor substrate faces a first surface of said second semiconductor substrate, wherein at least one of the facing surfaces of said first and second semiconductor substrates has surface irregularities, and performing a first impurity diffusion on a second surface of said first semiconductor substrate, which is opposite to said first surface of said first semiconductor substrate, and on a second surface of said second semiconductor substrate which is opposite to said first surface of said second semiconductor substrate.

9. A method of making a photovoltaic device comprising arranging a semiconductor substrate such that a first surface thereof faces a diffusion protecting plate and performing an impurity diffusion on a second surface of said semiconductor substrate which is opposite to said first surface, wherein said diffusion is carried out by holding said semiconductor substrate and said diffusion protecting plate in each of grooves of a boat, and said boat has a structure such that said semiconductor substrate and said diffusion protecting plate are obliquely held therein.

10. A method of making a photovoltaic device comprising arranging a semiconductor substrate such that a first horizontal surface thereof faces and contacts a horizontal surface of a diffusion protecting plate and performing an impurity diffusion on a second surface of said semiconductor substrate which is opposite to said first surface, wherein said impurity diffusion is carried out by using a vertical furnace.

11. A method of making a photovoltaic device comprising arranging a semiconductor substrate such that a first surface thereof faces a diffusion protecting plate and performing an impurity diffusion on a second surface of said semiconductor substrate which is opposite to said first surface, wherein a boron diffusion on said first surface is carried out so as to form a boron diffusion layer before said impurity diffusion, and a boron concentration profile along a cross section perpendicular to said first surface of said semiconductor substrate after said impurity diffusion is such that an impurity concentration in said first surface is equal to or greater than 50% of a maximum value of said boron concentration of said boron concentration profile.

* * * * *